United States Patent
Trang et al.

(10) Patent No.: US 11,742,304 B2
(45) Date of Patent: Aug. 29, 2023

(54) RADIO FREQUENCY TRANSISTOR AMPLIFIERS AND OTHER MULTI-CELL TRANSISTORS HAVING ISOLATION STRUCTURES

(71) Applicant: Wolfspeed, Inc., Durham, NC (US)

(72) Inventors: Frank Trang, San Jose, CA (US);
Qianli Mu, San Jose, CA (US);
Haedong Jang, San Jose, CA (US);
Zulhazmi Mokhti, Morgan Hill, CA (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/379,420

(22) Filed: Jul. 19, 2021

(65) Prior Publication Data
US 2021/0351141 A1 Nov. 11, 2021

Related U.S. Application Data

(63) Continuation of application No. 16/823,659, filed on Mar. 19, 2020, now Pat. No. 11,069,635, which is a
(Continued)

(51) Int. Cl.
*H01L 23/66* (2006.01)
*H01L 23/00* (2006.01)
(Continued)

(52) U.S. Cl.
CPC .......... *H01L 23/66* (2013.01); *H01L 23/4824* (2013.01); *H01L 24/09* (2013.01);
(Continued)

(58) Field of Classification Search
CPC ..... H01L 23/66; H01L 23/4824; H01L 24/09; H01L 24/49; H01L 29/42356; H01L 2223/6611
(Continued)

(56) References Cited

U.S. PATENT DOCUMENTS

| 4,498,093 A | 2/1985 | Allyn et al. |
| 4,721,986 A | 1/1988 | Kinzer |

(Continued)

FOREIGN PATENT DOCUMENTS

| JP | 06-043970 | 6/1994 |
| JP | 2002299351 A | 10/2002 |

(Continued)

OTHER PUBLICATIONS

PCT Notification Concerning Transmittal of International Preliminary Report on Patentability, dated Jan. 28, 2021 for corresponding PCT International Application No. PCT/US2019/042359.
(Continued)

*Primary Examiner* — Tu-Tu V Ho
(74) *Attorney, Agent, or Firm* — Myers Bigel, P.A.

(57) ABSTRACT

A multi-cell transistor includes a semiconductor structure, a plurality of unit cell transistors that are electrically connected in parallel, each unit cell transistor extending in a first direction in the semiconductor structure, wherein the unit cell transistors are spaced apart from each other along a second direction, and an isolation structure that is positioned between a first group of the unit cell transistors and a second group of the unit cell transistors and that extends above the semiconductor structure.

20 Claims, 16 Drawing Sheets

Related U.S. Application Data continuation of application No. 16/208,940, filed on Dec. 4, 2018, now Pat. No. 10,615,135, which is a continuation-in-part of application No. 16/039,703, filed on Jul. 19, 2018, now Pat. No. 10,600,746.

(51) Int. Cl.
*H01L 29/423* (2006.01)
*H01L 23/482* (2006.01)

(52) U.S. Cl.
CPC ........ *H01L 24/49* (2013.01); *H01L 29/42356* (2013.01); *H01L 2223/6611* (2013.01)

(58) Field of Classification Search
USPC .......................................................... 257/499
See application file for complete search history.

(56) References Cited

U.S. PATENT DOCUMENTS

| | | |
|---|---|---|
| 5,025,296 A | 6/1991 | Fullerton et al. |
| 5,430,247 A | 7/1995 | Bockelman |
| 5,500,522 A | 3/1996 | Eshraghian et al. |
| 5,592,006 A | 1/1997 | Merrill |
| 5,744,843 A | 4/1998 | Efland et al. |
| 6,023,086 A | 2/2000 | Reyes et al. |
| 6,274,896 B1 | 8/2001 | Gibson et al. |
| 6,316,793 B1 | 11/2001 | Sheppard et al. |
| 6,507,047 B2 | 1/2003 | Litwin |
| 6,765,268 B2 | 7/2004 | Akamine et al. |
| 6,900,482 B2 | 5/2005 | Aoki et al. |
| 7,135,747 B2 | 11/2006 | Allen et al. |
| 7,834,461 B2 | 11/2010 | Asai et al. |
| 7,851,832 B2 | 12/2010 | Takagi |
| 7,906,799 B2 | 3/2011 | Sheppard et al. |
| 8,003,525 B2 | 8/2011 | Okamoto |
| 8,026,596 B2 | 9/2011 | Singhal et al. |
| 8,076,994 B2 | 12/2011 | Farrell et al. |
| 8,178,908 B2 | 5/2012 | Greenberg et al. |
| 8,304,271 B2 | 11/2012 | Huang et al. |
| 8,410,580 B2 | 4/2013 | Hill et al. |
| 8,536,622 B2 | 9/2013 | Hosoda et al. |
| 8,692,371 B2 | 4/2014 | Min |
| 8,860,093 B2 | 10/2014 | Sasaki et al. |
| 8,866,197 B2 | 10/2014 | Becker et al. |
| 8,872,279 B2 | 10/2014 | Greenberg et al. |
| 9,136,396 B2 | 9/2015 | Ko et al. |
| 9,190,479 B1 | 11/2015 | Greenberg et al. |
| 9,419,667 B2 | 8/2016 | Lobianco et al. |
| 9,564,861 B2 | 2/2017 | Zhao et al. |
| 9,607,953 B1 | 3/2017 | Li et al. |
| 9,653,410 B1 | 5/2017 | Holmes et al. |
| 9,741,673 B2 | 8/2017 | Andre et al. |
| 9,786,660 B1 | 10/2017 | Farrell et al. |
| 9,917,104 B1 | 3/2018 | Roizin et al. |
| 9,979,361 B1 | 5/2018 | Mangaonkar et al. |
| 10,270,402 B1 | 4/2019 | Holmes et al. |
| 10,483,352 B1 | 11/2019 | Mokhti et al. |
| 10,506,704 B1 | 12/2019 | Embar et al. |
| 10,600,746 B2 | 3/2020 | Trang et al. |
| 10,763,334 B2 | 9/2020 | Trang et al. |
| 10,923,585 B2 | 2/2021 | Bothe et al. |
| 10,943,821 B2 | 3/2021 | Kosaka et al. |
| 10,971,612 B2 | 4/2021 | Bothe et al. |
| 11,417,746 B2 | 8/2022 | Trang et al. |
| 11,424,333 B2 | 8/2022 | Trang et al. |
| 2001/0012671 A1 | 8/2001 | Hoshino et al. |
| 2002/0033508 A1 | 3/2002 | Morikawa et al. |
| 2002/0039038 A1 | 4/2002 | Miyazawa |
| 2002/0066908 A1 | 6/2002 | Smith |
| 2002/0167023 A1 | 11/2002 | Chavarkar et al. |
| 2003/0013276 A1 | 1/2003 | Asano et al. |
| 2003/0102482 A1 | 6/2003 | Saxler |
| 2004/0061129 A1 | 4/2004 | Saxler et al. |
| 2005/0133829 A1 | 6/2005 | Kunii et al. |
| 2006/0081985 A1 | 4/2006 | Beach et al. |
| 2008/0100404 A1 | 5/2008 | Vice |
| 2008/0149940 A1 | 6/2008 | Shibata et al. |
| 2008/0157222 A1 | 7/2008 | Wang |
| 2009/0020848 A1 | 1/2009 | Ono et al. |
| 2009/0108357 A1 | 4/2009 | Takagi |
| 2009/0212846 A1 | 8/2009 | Cutter |
| 2009/0278207 A1 | 11/2009 | Greenberg et al. |
| 2010/0140665 A1 | 6/2010 | Singbal et al. |
| 2011/0018631 A1 | 1/2011 | Ng et al. |
| 2011/0102077 A1* | 5/2011 | Lamey .................... H01L 29/78 327/594 |
| 2012/0012908 A1 | 1/2012 | Matsunaga |
| 2012/0112819 A1 | 5/2012 | Greenberg et al. |
| 2012/0199847 A1 | 8/2012 | Takagi |
| 2012/0267795 A1 | 10/2012 | Tadayuki |
| 2013/0099286 A1 | 4/2013 | Imada |
| 2013/0228787 A1 | 9/2013 | Yamamura |
| 2013/0313653 A1 | 11/2013 | Brech |
| 2014/0014969 A1 | 1/2014 | Kunii et al. |
| 2015/0084135 A1 | 3/2015 | Miura et al. |
| 2015/0129965 A1 | 5/2015 | Roy et al. |
| 2015/0145025 A1 | 5/2015 | Yoshida et al. |
| 2015/0170986 A1 | 6/2015 | Szymanowski et al. |
| 2015/0243657 A1 | 8/2015 | Lin et al. |
| 2015/0279781 A1 | 10/2015 | Kaibara et al. |
| 2015/0311131 A1 | 10/2015 | Watts et al. |
| 2015/0333051 A1 | 11/2015 | Greenberg et al. |
| 2015/0349727 A1 | 12/2015 | Flowers et al. |
| 2016/0380606 A1 | 12/2016 | Limjoco et al. |
| 2017/0154839 A1 | 6/2017 | Lin et al. |
| 2017/0221878 A1 | 8/2017 | Risaki |
| 2017/0271329 A1 | 9/2017 | Farrell et al. |
| 2017/0271497 A1 | 9/2017 | Fayed et al. |
| 2018/0026125 A1 | 1/2018 | Liao et al. |
| 2018/0047822 A1 | 2/2018 | Lin et al. |
| 2018/0190814 A1 | 7/2018 | Pendharkar et al. |
| 2018/0261566 A1 | 9/2018 | Babcock et al. |
| 2020/0027850 A1 | 1/2020 | Trang et al. |
| 2020/0075479 A1 | 3/2020 | Khalil et al. |
| 2020/0083370 A1 | 3/2020 | Renaud |

FOREIGN PATENT DOCUMENTS

| | | |
|---|---|---|
| JP | 2003115732 A | 4/2003 |
| JP | 2006156902 A | 6/2006 |
| JP | 2007173731 A | 7/2007 |
| JP | 2008507843 A | 3/2008 |
| JP | 2010147254 A | 7/2010 |
| JP | 2011524079 A | 8/2011 |
| JP | 2012023074 A | 2/2012 |
| JP | 2012044003 A | 3/2012 |
| JP | 2013247618 A | 12/2013 |
| JP | 5505915 B1 | 3/2014 |
| JP | 2014078568 A | 5/2014 |
| JP | 2014187084 A | 10/2014 |
| JP | 2015072975 A | 4/2015 |
| JP | 2016036014 A | 3/2016 |
| JP | 2016100471 A | 5/2016 |
| JP | 2017212287 A | 11/2017 |
| KR | 20140124340 A | 10/2014 |
| KR | 20170038020 A | 4/2017 |
| WO | 2012176399 A1 | 12/2012 |
| WO | 2014097524 A1 | 6/2014 |
| WO | 2016181954 A1 | 11/2016 |
| WO | 2018078686 A1 | 5/2018 |

OTHER PUBLICATIONS

PCT Notification of Transmittal of the International Search Report and the Written Opinion of the International Searching Authority, or the Declaration, dated Jan. 24, 2020, for corresponding PCT International Application No. PCT/US2019/042359.

* cited by examiner

RADIO FREQUENCY TRANSISTOR AMPLIFIERS AND OTHER MULTI-CELL TRANSISTORS HAVING ISOLATION STRUCTURES

CROSS-REFERENCE TO RELATED APPLICATION

The present application is a continuation of U.S. patent application Ser. No. 16/823,659, filed Mar. 19, 2020, which is a continuation of U.S. patent application Ser. No. 16/208,940, filed Dec. 4, 2018 (now U.S. Pat. No. 10,615,135, issued Apr. 7, 2020), which is a continuation-in-part application of, and claims priority to, U.S. application Ser. No. 16/039,703, filed Jul. 19, 2018 (now U.S. Pat. No. 10,600,746, issued Mar. 24, 2020), the entire contents of which is incorporated by reference in their entireties herein.

FIELD

The inventive concepts described herein relate to microelectronic devices and, more particularly, to transistors having unit cell-based structures.

BACKGROUND

Electrical circuits requiring high power handling capability while operating at high frequencies, such as radio frequencies (500 MHz), S-band (3 GHz), and X-band (10 GHz), have become more prevalent in recent years. Because of the increase in high power, high frequency circuits, there has been a corresponding increase in demand for transistor amplifiers which are capable of reliably operating at radio and microwave frequencies while still being capable of handling high power loads.

A field effect transistor is a well-known type of transistor that is formed in a semiconductor structure. A source region, a drain region and a channel region are provided in the semiconductor material, with the channel region being between the source and drain regions. A gate electrode, which is often referred to as a gate finger, is formed above the channel region. The gate finger may be formed of a conductive material such as, for example, a semiconductor material, a metal, or a metal alloy. A source contact is electrically connected to the source region and a drain contact (often referred to as a "drain finger") is electrically connected to the drain region.

The power handling capabilities of a transistor may be a function of the gate periphery of the transistor, with larger gate peripheries corresponding to increased power handling capabilities. The gate periphery of a transistor refers to the distance that the gate finger extends between the source and drain regions. This distance is also referred to as the "width" of the gate finger. Thus, increasing the width of a gate finger is one technique for increasing the gate periphery, and hence the power handling capabilities, of a transistor. Another technique for increasing the effective gate periphery of a transistor is to provide a plurality of transistor cells that are electrically connected in parallel in a unit cell configuration to form a multi-cell transistor. For example, a high power multi-cell transistor may include a plurality of gate fingers that extend in parallel to each other. Each gate finger may define a separate unit cell transistor.

FIG. 1 is a schematic plan view of a conventional multi-cell transistor 1. As shown in FIG. 1, the conventional transistor 1 includes a plurality of gate fingers 30, a plurality of source fingers 40, and a plurality of drain fingers 50 that are formed on a semiconductor structure 10. The gate fingers 30 are spaced apart from each other along a first direction (e.g., the y-direction in FIG. 1) and extend in a second direction (e.g., the x-direction in FIG. 1). The gate fingers 30 are electrically connected to each other through a gate mandrel 32. The source fingers 40 are spaced apart from each other along the first direction and extend in the second direction. The source fingers 40 may be electrically connected to each other through vias or other structures (not visible in FIG. 1) and may be electrically connected to a source contact on the bottom side of the transistor 1 (not visible in FIG. 1). The drain fingers 50 are likewise spaced apart from each other along the first direction and extend in the second direction, and are electrically connected to each other through a drain mandrel 52. Each gate finger 30 extends in the x-direction between a pair of adjacent source and drain fingers 40, 50. The gate, source and drain fingers 30, 40, 50 may each comprise a conductive material, such as a metal or a metal alloy.

In FIG. 1, a representative unit cell transistor 1 is illustrated at box 60 and may include a gate finger 30, the source and drain fingers 40, 50 on opposed sides of the gate finger 30, and the portion of the semiconductor structure 10 that underlies the gate, source and drain fingers 30, 40, 50. In many cases, one or more of the source fingers 40 and/or the drain fingers 50 (as well as the source regions and/or drain regions in the semiconductor structure 10 underneath the source and drain fingers 40; 50) may be shared by two adjacent gate fingers 30. As shown in FIG. 1, in such cases, each unit cell transistor 60 may be considered to include half of the shared source finger 40 and half of the shared drain finger 50. The "gate length" refers to the distance of the gate finger 30 in the y-direction, while the "gate width" is the distance by which the gate finger 30 overlaps (in plan view) with its associated source and drain fingers 40, 50 in the x-direction. Note that in many applications the "gate width" is much larger than the "gate length." The gate periphery of the multi-cell transistor 1 is the sum of the gate widths for each unit cell transistor 60 thereof.

Multi-cell transistors that include a plurality of unit cell transistors that are electrically connected in parallel may be used in a variety of different applications, such as for DC amplifiers, RF amplifiers, switches and the like. Multi-cell transistors are often used in applications requiring high power handling capabilities as the unit cell structure increases the power handling capabilities of the device.

SUMMARY

Various embodiments described herein provide transistor device having increased isolation between unit cells of a transistor device. The isolation may be provided by gaps, metal pads, isolation structures, or any combination thereof.

Pursuant to embodiments of the present invention, a multi-cell transistor comprises a semiconductor structure, a plurality of unit cell transistors that are electrically connected in parallel, each unit cell transistor extending in a first direction in the semiconductor structure, wherein the unit cell transistors are spaced apart from each other along a second direction, and an isolation structure that is positioned between a first group of the unit cell transistors and a second group of the unit cell transistors.

In some embodiments, the isolation structure is above the semiconductor structure.

In some embodiments, a first distance in the second direction between two adjacent unit cell transistors in the first group of the unit cell transistors is less than a second distance in the second direction between a first unit cell transistor that is at one end of the first group of the unit cell transistors and a second unit cell transistor that is in the second group of the unit cell transistors, where the second unit cell transistor is adjacent the first unit cell transistor.

In some embodiments, the isolation structure is electrically connected to a reference signal.

In some embodiments, the isolation structure further comprises a metal pad, and a wall structure that is electrically connected to the metal pad.

In some embodiments, the wall structure comprises a plurality of wall segments extending vertically from the metal pad.

In some embodiments, the wall structure comprises a plurality of first vertical wall segments connected with a plurality of second horizontal wall segments.

In some embodiments, the isolation structure comprises a plurality of vias that are disposed between the metal pad and the semiconductor structure.

In some embodiments, the isolation structure is electrically connected to a source region of one of the plurality of unit cell transistors.

In some embodiments, the multi-cell transistor further comprises a wall structure that comprises an isolation material configured to reduce a mutual coupling between the first group of the unit cell transistors and the second group of the unit cell transistors.

In some embodiments, the isolation material is a conductive isolation material, a magnetic isolation material, or a lossy dielectric isolation material.

In some embodiments, the multi-cell transistor further comprises an input bond wire electrically connected to a gate of a first unit cell transistor of the plurality of unit cell transistors, an output bond wire electrically connected to a drain of the first unit cell transistor, and a secondary isolation material between the input bond wire and the output bond wire.

In some embodiments, the isolation structure further comprises a wall structure, where the secondary isolation material is electrically connected to the wall structure.

In some embodiments, the multi-cell transistor further comprises a plastic overmold on the secondary isolation material and the wall structure.

In some embodiments, the multi-cell transistor further comprises a wall structure comprising a bond wire that is electrically connected to a metal pad of the isolation structure, and an isolation material electrically connected to the bond wire.

Pursuant to embodiments of the present invention, a multi-cell transistor comprises a semiconductor structure, a plurality of unit cell transistors that are electrically connected in parallel, each unit cell transistor including a gate finger that extends in a first direction on a top surface of the semiconductor structure, the gate fingers spaced apart from each other along a second direction and arranged on the top surface of the semiconductor structure in a plurality of groups, and a respective isolation structure on the top surface of the semiconductor structure between each pair of adjacent groups.

In some embodiments, each respective isolation structure comprises a metal pad and a wall structure extending vertically from the metal pad.

In some embodiments, each isolation structure has a respective length in the second direction that exceeds a length in the second direction of a first of the unit cell transistors.

In some embodiments, each isolation structure further comprises a plurality of vias that physically and electrically connect each respective metal pad to a source region in the semiconductor structure.

In some embodiments, the wall structure comprises a plurality of wall segments extending vertically from the metal pad.

In some embodiments, the wall structure comprises an isolation material configured to reduce a mutual coupling between a first of the groups and a second of the groups.

In some embodiments, the isolation material is a conductive isolation material, a magnetic isolation material, or a lossy dielectric isolation material.

In some embodiments, the wall structure is electrically connected to the metal pad.

In some embodiments, each unit cell transistor comprises a drain finger that extends in the first direction on the top surface of the semiconductor structure, and the multi-cell transistor further comprises an input bond wire electrically connected to at least one of the gate fingers, an output bond wire electrically connected to at least one of the drain fingers, and a secondary isolation material extending in the second direction between the input bond wire and the output bond wire.

In some embodiments, the secondary isolation material is electrically connected to at least one wall structure of the isolation structures.

In some embodiments, each respective isolation structure comprises a wall structure, and the secondary isolation material extends in the second direction and the wall structure extends in the first direction.

Pursuant to embodiments of the present invention, a transistor device comprises a multi-cell transistor including a plurality of unit cell transistors that are electrically connected in parallel and that are spaced apart along a second direction and a first isolation structure that is positioned between a first group of the unit cell transistors and a second group of the unit cell transistors and extends in a first direction, an input bond wire electrically connected to a gate of a first unit cell transistor of the plurality of unit cell transistors, an output bond wire electrically connected to a drain of the first unit cell transistor, and a second isolation structure extending in the second direction between the input bond wire and the output bond wire.

In some embodiments, the transistor device further comprises a plurality of vias that that electrically connect a metal pad of the first isolation structure to at least one source region of the unit cell transistors.

In some embodiments, the first isolation structure comprises a metal pad that is electrically connected to a reference signal, and a wall structure that is electrically connected to metal pad, where the second isolation structure is electrically connected to the wall structure.

In some embodiments, the wall structure comprises a plurality of wall segments extending vertically from the metal pad.

In some embodiments, the wall structure comprises a plurality of first vertical wall segments connected with a plurality of second horizontal wall segments.

In some embodiments, the transistor device further comprises a plastic overmold on the second isolation structure and the wall structure.

In some embodiments, the second isolation structure is on the wall structure.

In some embodiments, the wall structure comprises an isolation material configured to reduce a mutual coupling between the first group of the unit cell transistors and the second group of the unit cell transistors.

In some embodiments, the isolation material is a conductive isolation material, a magnetic isolation material, or a lossy dielectric isolation material.

In some embodiments, the first direction is orthogonal to the second direction.

DETAILED DESCRIPTION

Figure 1:
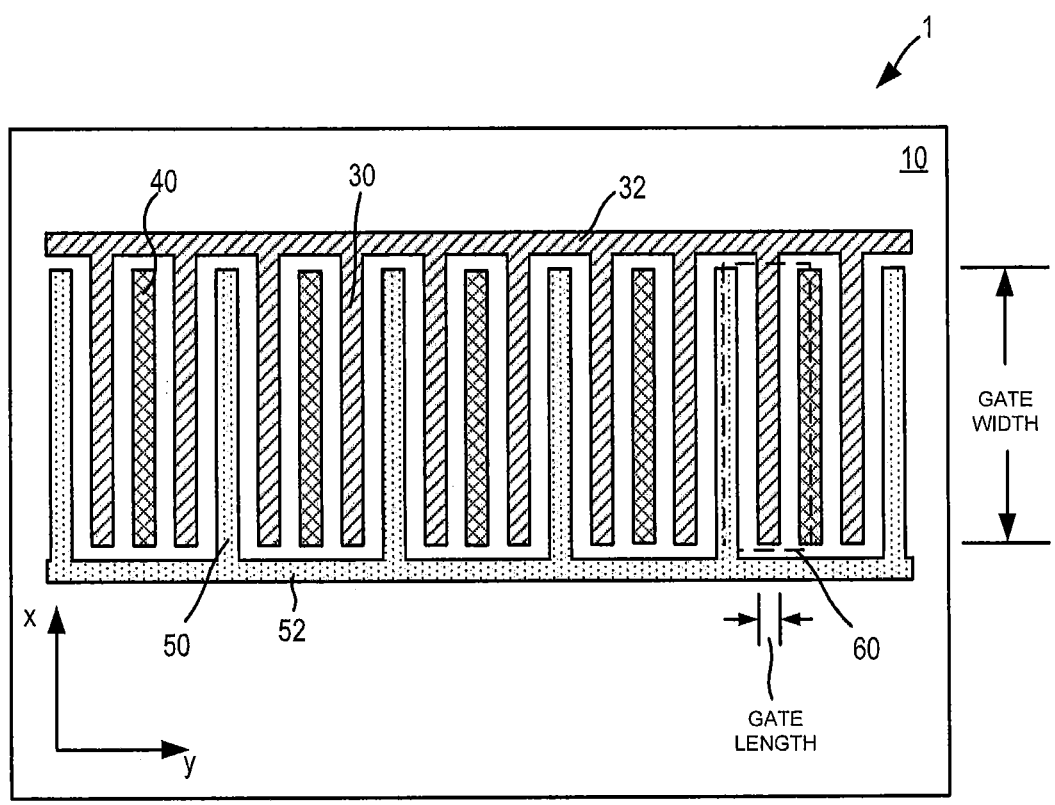
FIG. 1 is a schematic plan view of a conventional multi-cell transistor.

The power handling capability of a multi-cell transistor may be a function of the gate periphery of the transistor, with larger gate peripheries generally corresponding to higher power handling capabilities. Referring again to FIG. 1, the gate periphery of a multi-cell transistor may be increased in two ways. First, the gate fingers 30 may be made wider (i.e., extend further in the x-direction of FIG. 1). Second, the number of gate fingers 30 may be increased. Unfortunately, both techniques for increasing the gate periphery may have drawbacks. With respect to the first technique, when the gate fingers 30 are made wider (i.e., extended in the x-direction in FIG. 1), the high frequency performance of the transistor 1 may be adversely impacted. In addition, making the gate fingers 30 wider typically means that the gate fingers 30 must handle increased current levels, which can cause electromigration of the gate finger metallization. With respect to the second technique, it has been found that increasing the number of gate fingers may degrade the performance of the multi-cell transistor. For example, with a multi-cell transistor RF power amplifier, increasing the number of gate fingers acts to degrade the DC to RF power conversion efficiency of the transistor.

It has been discovered that the degradation in DC to RF power conversion efficiency that has been observed when the number of gate fingers 30 is increased may be a result of mutual coupling between the gate fingers 30 (or groups of gate fingers 30) of the unit cell transistors. This mutual coupling may include both capacitive coupling and inductive coupling. Pursuant to embodiments of the present invention, multi-cell transistors are provided in which the unit cell transistors are divided into groups, and additional physical spacing and/or isolation structures may be positioned between the groups in order to reduce mutual coupling between the groups. By reducing the mutual coupling, it has been found that the number of gate fingers included in a multi-cell transistor may be increased, thereby increasing the gate periphery of the transistor, and hence the power handling capability thereof. This improved power handling capability may be achieved while still maintaining good performance characteristics.

Multi-cell transistors according to some embodiments of the present invention may have widened gaps between adjacent groups of unit cell transistors. As a result of these gaps, the distance between adjacent unit cell transistors within a group may be less than the distance between two adjacent unit cell transistors that are part of different groups. The distance between two adjacent unit cell transistors may be considered to be the distance between the gate fingers thereof. In example embodiments, the distance between two adjacent unit cell transistors that are part of different groups may be at least three, at least five or even at least eight times the distance between adjacent unit cell transistors within a group. The provision of these gaps between groups may significantly reduce mutual coupling between the unit cell transistors of different groups.

In some embodiments, isolation structures may be provided between adjacent groups of unit cell transistors. Each isolation structure may comprise a metal pad that is electrically connected to the source regions of the unit cell transistors. The electrical connection between each metal pad and the source regions may be provided, for example, by one or more rows of conductive vias that extend between each metal pad and a respective source region. In addition to electrically connecting each metal pad to the source regions, the rows of conductive vias may themselves act as isolation structures that reduce mutual coupling between two adjacent groups of unit cell transistors. In some embodiments, the isolation structures may reduce and/or eliminate the width of gaps between adjacent groups of the unit cell transistors. In some embodiments, reduction of mutual coupling between adjacent groups of the unit cell transistors may be provided by gaps, isolation structures, or any combination thereof.

In some embodiments, the metal pads may be located relatively far above the semiconductor structure (e.g., at a higher level than the gate fingers, the source fingers and/or the drain fingers) in order to provide increased isolation. In some embodiments, bond wires or other metal structures may be physically and/or electrically connected to each metal pad and may extend upwardly therefrom to further reduce the mutual coupling between adjacent groups of unit cell transistors. The net effect of this approach is that each group of unit cell transistors may operate substantially as a mini-multi-cell transistor, and the power of the each such mini-multi-cell transistor may be combined as the groups of unit cell transistors are themselves connected in parallel to provide the multi-cell transistor.

The above-described techniques provide a way of increasing the number of gate fingers of a multi-cell transistor, and hence the power-handling capabilities thereof, without significantly degrading the performance of the multi-cell transistor. As noted above, an alternative way for increasing the power-handling capabilities of a multi-cell transistor is to increase the width of the individual gate fingers. U.S. patent application Ser. No. 16/032,571 ("the '571 application"), filed Jul. 11, 2018, describes techniques for feeding the gate fingers of a multi-cell transistor from interior positions. This approach may facilitate increasing the widths of the gate fingers while avoiding in large part the performance degradations that occur when conventional gate fingers are increased in width. The entire content of the '571 application is incorporated herein by reference as if set forth fully herein. The techniques discussed in the '571 application may also be applied to the multi-cell transistors according to embodiments of the present invention to provide multi-cell transistors that have both increased numbers of gate fingers and gate fingers having increased gate widths, and hence substantially larger gate peripheries.

Embodiments of the present invention will now be described in greater detail with reference to FIGS. 2A-10.

Figure 2A:
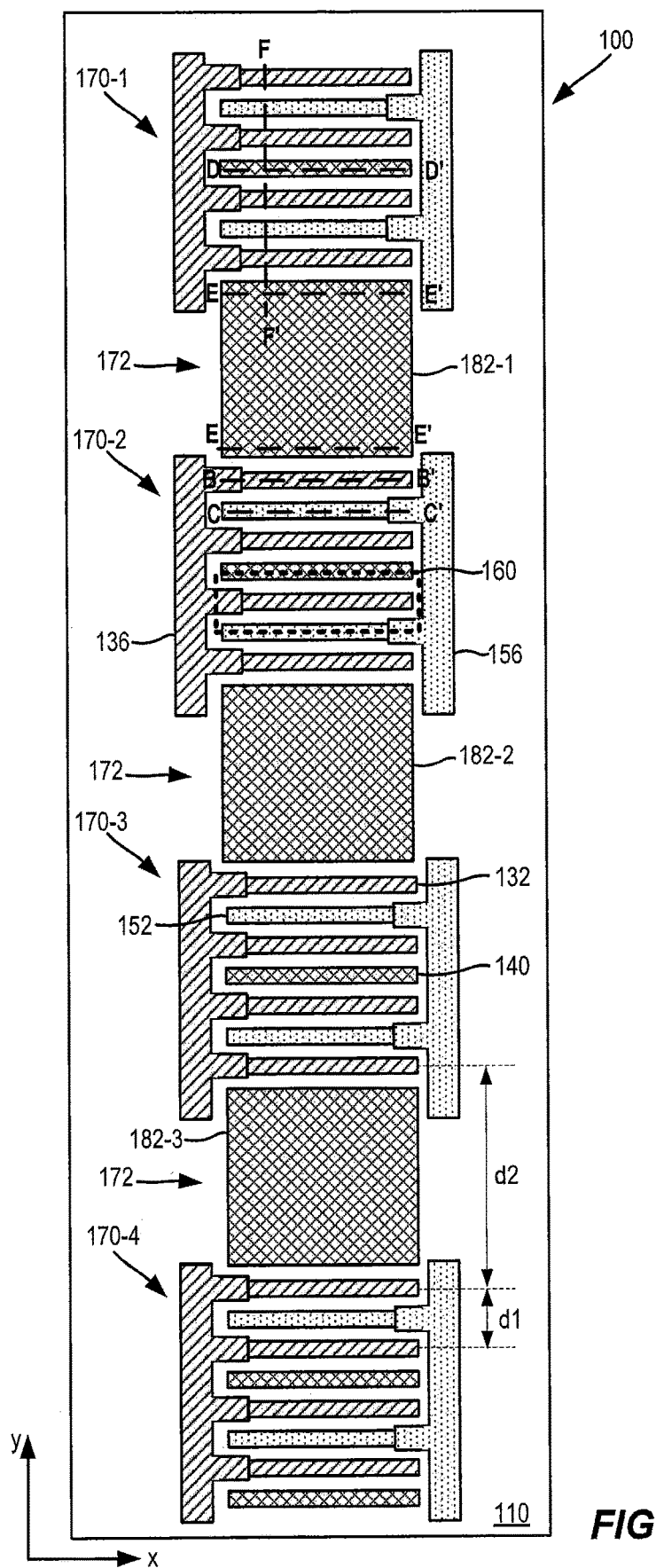
FIG. 2A is a plan view of a multi-cell transistor according to embodiments of the present invention.

FIG. 2A is a plan view of a multi-cell transistor 100 according to embodiments of the present invention. FIGS. 2B-2F are cross-sectional views of the multi-cell transistor 100 taken along lines B-B', C-C', D-D', E-E' and F-F' of FIG. 2A, respectively.

Referring to FIG. 2A, the multi-cell transistor 100 comprises a plurality of gate, source and drain contact structures that are formed on a semiconductor structure 110. The contact structures may comprise, for example, metal contacts and may comprise, among other things, a gate mandrel 136 and a drain mandrel 156, as well as gate runners 132, source fingers 140 and drain runners 152.

Figure 2B:
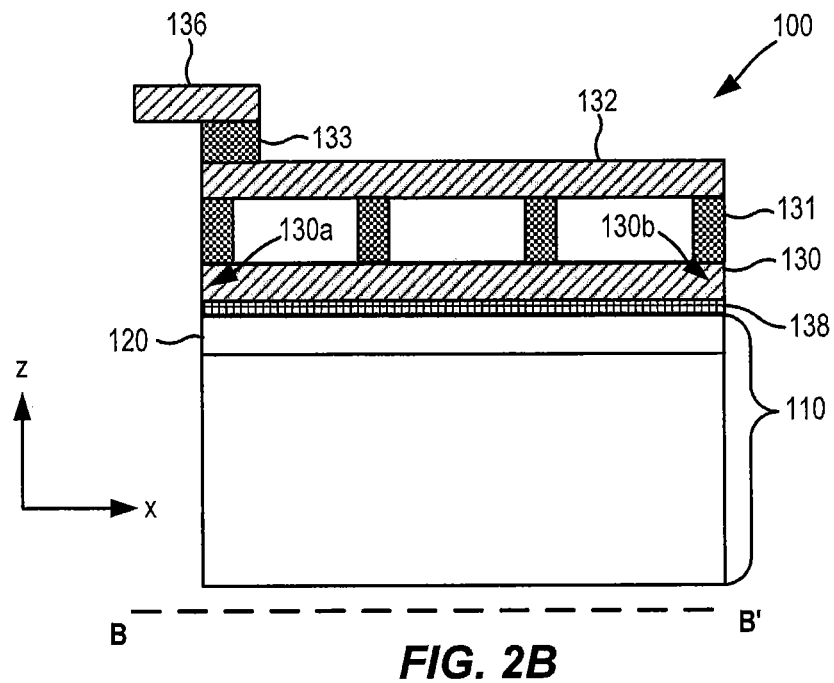
FIGS. 2B-2F are cross-sectional views taken along lines B-B', C-C', D-D', E-E' and F-F' of FIG. 2A, respectively.

FIGS. 2A and 2B schematically illustrate the gate contact structures of the multi-cell transistor 100. As shown in FIGS. 2A and 2B, a plurality of gate runners 132 extend along the upper surface of the semiconductor structure 110 in a first direction (the x-direction in FIGS. 2A-2B). As shown in FIG. 2B, a gate finger 130 extends underneath each gate runner 132. Each gate finger 130 extends along the upper surface of the semiconductor structure 110 in the first direction (the x-direction in FIGS. 2A-2B). A gate insulating layer 138 may be provided between each gate finger 130 and the semiconductor structure 110 in unit cell transistor designs such as MOSFETs and LDMOS unit cell transistors that include gate insulating layers. A channel 120 may be provided in the upper portion of the semiconductor structure 110 underneath each gate finger 130. When the multi-cell transistor is in its ON state, current may flow through each channel 120. A plurality of conductive vias 131 may electrically connect each gate runner 132 to a respective one of the gate fingers 130. Each gate runner 132 may be electrically connected to the gate mandrel 136 by a respective conductive via 133.

In the depicted embodiment, each gate runner 132 vertically overlaps a respective one of the gate fingers 130 (i.e., a line drawn perpendicular to a major surface of the semiconductor structure passes through each gate runner 132 and its associated gate finger 130). In other embodiments, each gate runner 132 may be offset from its associated gate finger 130 in, for example, the y-direction. In such embodiments, an intermediate conductive layer (not shown) may be provided between each gate runner 132 and its associated gate finger 130, and a first set of conductive vias may electrically connect each gate runner 132 to the intermediate conductive layer, and a second set of conductive vias may electrically connect each intermediate conductive layer to its associated gate finger 130.

Figure 2C:
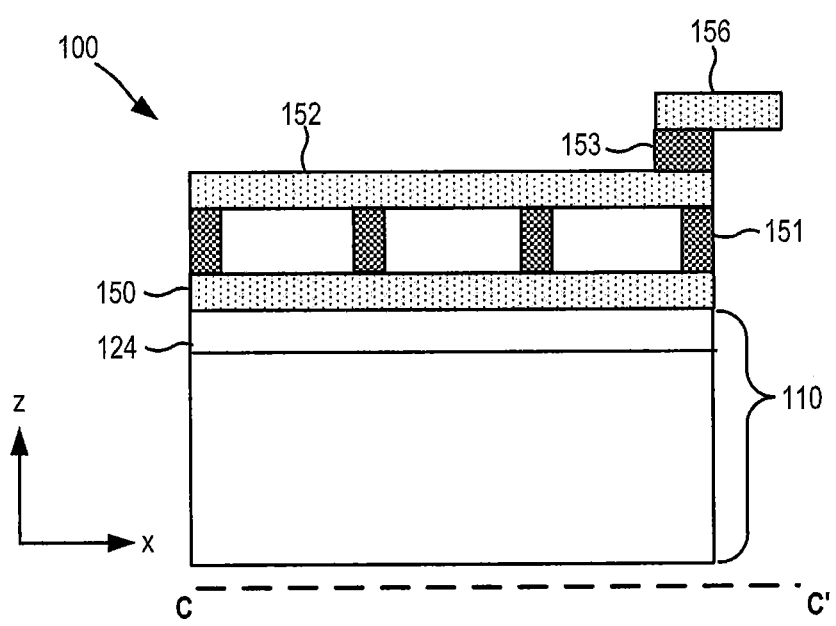

FIGS. 2A and 2C schematically illustrate the drain contact structures of the multi-cell transistor 100. As shown in FIGS. 2A and 2C, a plurality of drain runners 152 extend along the upper surface of the semiconductor structure 110 in the first direction (the x-direction in FIGS. 2A-2B). As shown in FIG. 2C, a drain finger 150 extends underneath each drain runner 152. Each drain finger 150 extends along the upper surface of the semiconductor structure 110 in the first direction (the x-direction in FIGS. 2A-2B). A drain region 124 may be provided in the upper portion of the semiconductor structure 110 underneath each respective drain finger 150. A plurality of conductive vias 151 may electrically connect each drain runner 152 to a respective one of the drain fingers 150. Each drain runner 152 may be electrically connected to the drain mandrel 156 by a respective conductive via 153.

In the depicted embodiment, each drain runner 152 directly overlies a respective one of the drain fingers 150. In other embodiments, each drain runner 152 may be offset from its associated drain finger 150 in the y-direction, and an intermediate conductive layer (not shown) may be provided between each drain runner 152 and its associated drain finger 150, and a first set of conductive vias may electrically connect each drain runner 152 to the intermediate conductive layer, and a second set of conductive vias may electrically connect each intermediate conductive layer to its associated drain finger 150.

Figure 2D:
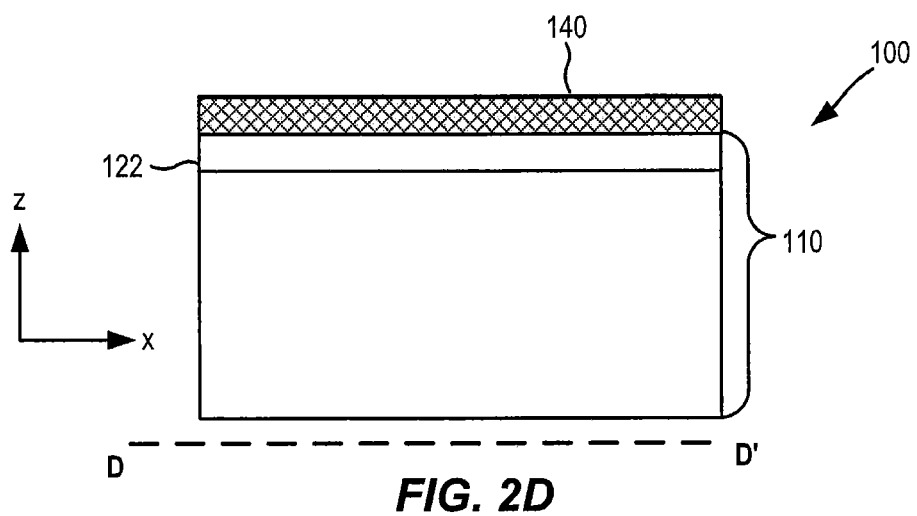
Figure 2E:
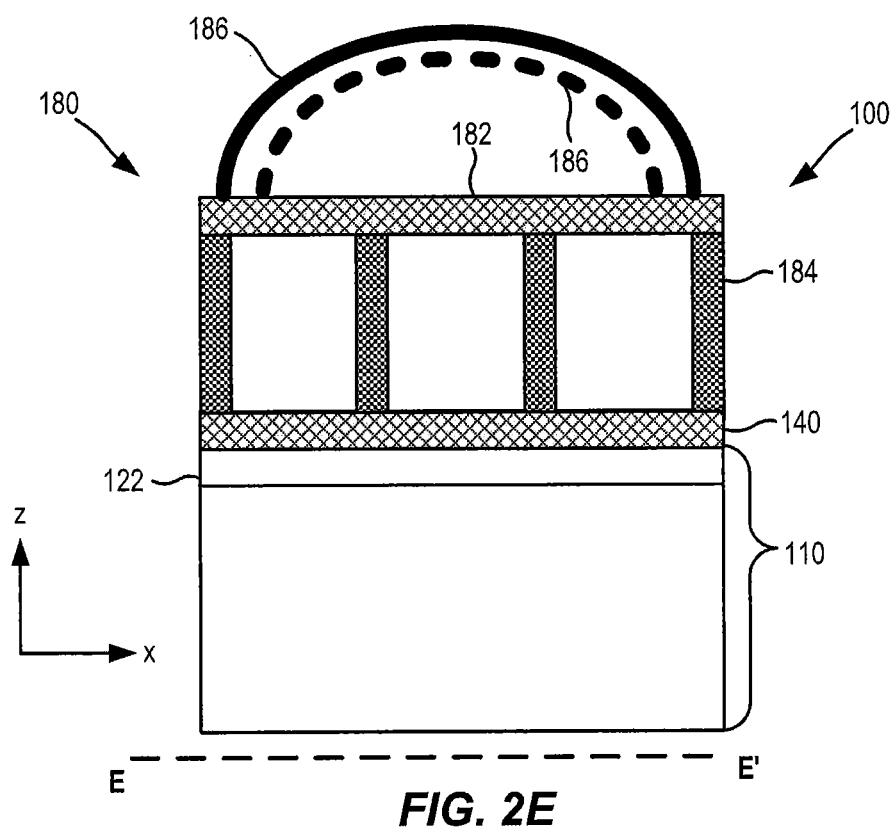

FIGS. 2A, 2D, and 2E schematically illustrate the source contact structures of the multi-cell transistor 100. Referring first to FIGS. 2A and 2D, a plurality of source fingers 140 extend along the upper surface of the semiconductor structure 110 in the first direction (the x-direction in FIGS. 2A-2B). A source region 122 may be provided in the upper portion of the semiconductor structure 110 underneath each respective source finger 140. Conductive vias that are not shown in the figures may electrically connect each source finger 140 to a source contact (not shown) that is provided on the bottom side of the semiconductor structure 110.

Referring to FIGS. 2A-2E, the multi-cell transistor 100 may include three metal pads 182-1, 182-2, 182-3 (which are collectively referred to as metal pads 182). Each metal pad 182 may comprise all or part of a respective plurality of isolation structures 180, although the present disclosure is not limited thereto. As is shown in FIGS. 2A and 2E, a first end of each metal pad 182 may be disposed above a respective first source finger 140 and a second end of the metal pad 182 may be disposed above a respective second source finger 140. First and second rows of conductive vias 184 may electrically connect the metal pad 182 to the respective first and second source fingers 140. The conductive vias 184 may also comprise part of the isolation structures 180. In some embodiments, the first and second source fingers 140 may be omitted and the first and second rows of conductive vias 184 may physically and electrically connect to respective first and second source regions 122 in the semiconductor structure 110. In some embodiments, a denser row of conductive vias 184 may be provided (e.g., as compared to the rows of conductive vias 131 that electrically connect each gate runner 132 to a respective gate finger 130 or to the rows of conductive vias 151 that electrically connect each drain runner 152 to a respective drain finger 150). By "denser" it is meant that the row includes a greater number of conductive vias 184. Alternatively or additionally, a plurality of rows of conductive vias 184 may be provided under each metal pad 182 (e.g., two rows, three rows, four rows, etc.)

Referring to FIGS. 2A-2E, each gate finger 130, along with an adjacent source finger 140 and drain finger 150, may define a unit cell transistor 160. Each unit cell transistor 160 further includes a channel region 120, a source region 122, and a drain region 124 that are formed in the upper region of the semiconductor structure 110. In the multi-cell transistor 100, the source fingers 140 and the drain fingers 150 are typically shared by two different gate fingers 130, and hence each unit cell transistor 160 may be viewed as including half of the shared source finger 140 and half of the shared drain finger 150. A dashed box in FIG. 2A identifies a representative unit cell transistor 160. Each unit cell transistor 160 extends in the semiconductor structure 110 (as the channel, source and drain regions 120, 122, 124 are in the semiconductor structure) and on top of the semiconductor structure 110 (as the gate, source and drain fingers 130, 140, 150 extend on top of the semiconductor structure 110).

The gate finger 130, the source finger 140 and the drain finger 150 for each unit cell transistor 160 each extend in a first direction (the x-direction in FIG. 2A). The gate fingers 130, the source fingers 140 and the drain fingers 150 are spaced apart from each other along a second direction (the y-direction in FIG. 2A), and hence the unit cell transistors 160 are also spaced apart from each other along the second direction. The second direction may be perpendicular to the first direction in some embodiments. As shown in FIG. 2B, each gate finger 130 may have a base end 130a that is adjacent the gate mandrel 136 and a distal end 130b that is remote from the gate mandrel. The base ends 130a of the gate fingers 130 may be aligned along the second direction, as is shown in FIG. 2A. The distal ends 130b of the gate fingers 130 may likewise be aligned along the second direction.

During operation, current flows between each source finger 140 and its associated drain finger 150 through a conduction path that includes the drain region 124, the channel region 120, and the source region 122 in the semiconductor structure 110. The amount of current may be modulated by a voltage signal applied to the gate fingers 130.

As is further shown in FIG. 2A, the unit cell transistors 160 are arranged in a plurality of groups 170-1 through 170-4 (collectively referred to as the groups 170). While in the depicted embodiment each group 170 includes a total of four unit cell transistors 160, it will be appreciated that more or fewer unit cell transistors 160 may be included in each group 170. For example, one or more of the groups 170 may include at least twenty unit cell transistors 160 in some embodiments, In other embodiments, one or more of the groups 170 may include at least forty unit cell transistors 160. It will likewise be appreciated that the number of unit cell transistors 160 in each group 170 need not be the same. Adjacent ones of the groups 170 may be separated by gaps 172. The gaps 172 need not all be the same size. As a result of the gaps 172, a first distance d1 between two adjacent unit cell transistors 160 in, for example, a first of the groups 170 may be less than a second distance d2 between two adjacent unit cell transistors that are part of different, adjacent ones of the groups 170. As discussed above, the distance between two adjacent unit cell transistors 160 may be considered to be the distance between the gate fingers 130 of the two unit cell transistors 160. The gaps 172 may extend between source regions 122 for two adjacent unit cell transistors 160 that are part of different ones of the groups 170. Herein, first and second unit cell transistors are considered to be "adjacent" each other if there is no intervening unit cell transistor between the first and second unit cell transistors.

In some embodiments, the second distance d2 may be at least three times larger than the first distance d1. In other embodiments, the second distance d2 may be at least five times larger than the first distance d1. In still other embodiments, the second distance d2 may be at least eight times larger than the first distance d1.

As is further shown in FIGS. 2A and 2E, the metal pads 182 extend above the source regions 122 for the unit cell transistors 160 on either side of the gap 172. In some embodiments, each metal pad 182 may be significantly longer in the second direction (the y-direction in FIGS. 2A-2E) than are the gate fingers 130, the source fingers 140, and/or the drain fingers 150. In some embodiments, each metal pad 182 may be at least three times longer in the second direction (the y-direction in FIGS. 2A-2E) than are the gate fingers 130, the source fingers 140 and/or the drain fingers 150. In other embodiments, each metal pad 182 may be at least five times longer in the second direction (the y-direction in FIGS. 2A-2D) than are the gate fingers 130, the source fingers 140 and/or the drain fingers 150. In still other embodiments, each metal pad 182 may be at least eight times longer in the second direction (the y-direction in FIGS. 2A-2D) than are the gate fingers 130, the source fingers 140 and/or the drain fingers 150.

In some embodiments, the metal pad 182 may have a length in the second direction (the y-direction in FIG. 2A) that is sufficient so that a bond wire 186 may be bonded to the metal pad 182. Each metal pad may have a top surface that is formed of a material (e.g., gold) that is suitable for wire bonding. As shown in FIG. 2E, the bond wire 186 may be bonded to the upper surface of the metal pad 182 so that the bond wire 186 extends upwardly from the metal pad 182. In some embodiments, both ends of the bond wire 186 may be bonded to the metal pad 182 so that the bond wire 186 extends in an arc above the metal pad 182. The bond wire 186 may also comprise part of the isolation structure 180 and may further reduce mutual coupling between adjacent groups 170 of unit cell transistors 160. As shown by the bond wire 186 that is drawn using a dotted line in FIG. 2E, in some embodiments, two or more bond wires 186 may be bonded side-by-side to each metal pad 182 to provide further isolation. The side-by-side bond wires 186 may extend to the same height or to different heights, as shown in FIG. 2E. In FIG. 2E, the bond wires 186 are shown as extending along the x-direction. In other embodiments, the bond wires 186 may extend along a different direction such as, for example, the y-direction. It will likewise be appreciated that the bond wires 186 may be replaced with other metal shielding structures in other embodiments that are, for example, bonded to the metal pad 182. For example, a bond and/or isolation wall could replace the bond wires 186 in other embodiments.

Each metal pad 182 and/or its associated conductive vias 184 and/or its associated bond wire(s) 186 may form an isolation structure 180 between two adjacent ones of the groups 170 of unit cell transistors 160. Each isolation structure 180 may reduce mutual coupling between the adjacent groups 170 of unit cell transistors 160. Though examples are illustrated in which the isolation structure 180 includes a metal pad 182, the present invention is not limited thereto. In some embodiments, the isolation structure 180 may include a conductive material other than metal, or may omit a conductive material entirely. In some embodiments, the isolation structure 180 may be formed of a magnetic isolation material, or a lossy dielectric isolation material.

Figure 2F:
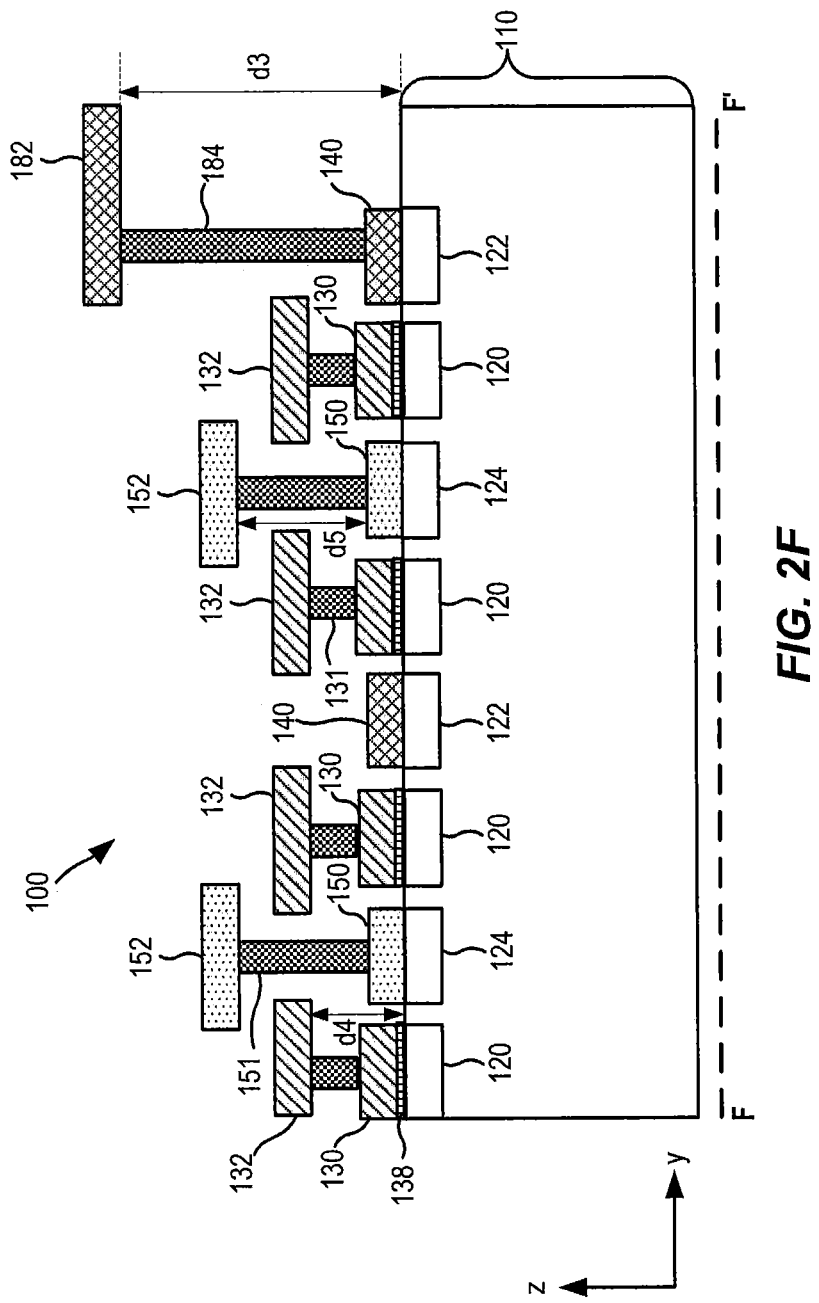

FIG. 2F is a cross-section taken along line F-F' of FIG. 2A. As shown in FIG. 2F, the gate fingers 130, the source fingers 140 and the drain fingers 150 may be formed above the respective channel regions 120, source regions 122 and drain regions 124 in the semiconductor structure 110. Gate insulating layers 138 may be provided between each gate finger 130 and its associated channel region 120. The gate insulating layers 138 are omitted if the transistor 100 is formed using unit cell transistors that do not include gate insulating layers (e.g., HEMT transistors). In some embodiments, the gate fingers 130, source fingers 140 and drain fingers 150 may be at the same level above the upper surface of the semiconductor structure 110. In other embodiments, upper surfaces of the gate fingers 130 may be at a higher level above the upper surface of the semiconductor structure 110 than are upper surfaces of the source fingers 140 and/or upper surfaces of the drain fingers 150 due to, for example, the inclusion of the gate insulating layer 138 between the gate fingers 130 and the semiconductor structure 110. While the gate fingers 130, source fingers 140 and drain fingers 150 are shown in FIG. 2F as being spaced apart from each other by the same distances in the y-direction, it will be appreciated that this need not be the case and that, in fact, in many multi-cell transistors the gate fingers 130 may closer to the drain fingers 150 than they are to the source fingers 140. It will also be appreciated that the various elements of FIG. 2F that are above the semiconductor structure 110 may be formed in one or more interlaying insulating layers that are not shown in order to simplify the drawings. These interlayer insulating layers may support the various conductive vias, runners, and the like and may also facilitate electrically isolating various ones of the elements.

The gate runners 132 and the drain runners 152 may be higher above the upper surface of the semiconductor structure 110 than are the gate fingers 130, source fingers 140, and drain fingers 150. In some embodiments, the gate runners 132 and the drain runners 152 may be at the same height above the semiconductor structure, although this need not be the case.

As is further shown in FIG. 2F, in some embodiments, the metal pad 182 may be formed at a higher level above the semiconductor structure 110 than are the gate runners 132 and/or the drain runners 152. In particular, a third distance d3 in the third direction (the z-axis direction) shown in FIG. 2F at which the metal pad 182 is formed above the semiconductor structure 110 may be greater than a fourth distance d4 in the third direction at which the gate runners 132 are formed above the semiconductor structure 110 and/or greater than a fifth distance d5 in the third direction at which the drain runners 152 are formed above the semiconductor structure 110. By forming the metal pads 182 at a greater height above the semiconductor structure 110, the amount of isolation between adjacent groups 170 of unit cell transistors 160 may be increased. Since the metal pads 182 are at a greater height above the semiconductor structure 110 than the gate runners 132 and the drain runners 152, the conductive vias 184 that connect each metal pad 182 to the source regions 122 in the semiconductor structure 110 may be taller than the conductive vias 131, 151 that connect the gate runners 132 and the drain runners 152 to gate fingers 130 and the drain fingers 150, respectively. The taller conductive vias 184 may also increase the amount of isolation (i.e., decrease the amount of mutual coupling) between adjacent groups 170 of unit cell transistors 160.

The gaps 172 and/or the isolation structures 180 may reduce mutual coupling between the unit cell transistors 160 of adjacent groups 170. While mutual coupling between unit cell transistors 160 may be inevitable in devices that include a large number of unit cell transistors 160 within a small physical footprint, it has been found that when the number of unit cell transistors 160 is made large enough, the performance of a multi-cell transistor may degrade in some applications. One such application where performance may be degraded is in LDMOS RF power amplifiers. In order to achieve high output powers, which are required in, for example, many wireless communications applications, it may be necessary to include a large number of unit cell transistors (e.g., hundreds of unit cell transistors) in a multi-cell transistor. It has been found, however, that while increasing the number of unit cell transistors may increase the output power of the multi-cell transistor, the DC to RF power conversion efficiency (also referred to as "drain efficiency") of the multi-cell transistor may become degraded. The high levels of mutual coupling and high temperatures may be responsible for this degradation in performance.

As shown above, one technique for reducing the mutual coupling is to divide the unit cell transistors 160 into groups 170, and to then provide isolation structures 180 and/or increased distances (gaps 172) between the groups 170 of unit cell transistors 160. While mutual coupling may still be relatively high between unit cell transistors 160 within each group 170, the level of mutual coupling between unit cell transistors 160 in adjacent groups 170 may be much lower. It has been found that by limiting the number of unit cell transistors 160 that mutually couple with each other, the degradation in DC to RF power conversion efficiency may be reduced. Moreover, the overall output power of the multi-cell transistor may be increased by adding additional groups 170. As discussed herein, the gaps 172 also help with heat dissipation and hence can also help reduce heat-related performance degradation.

Typically, one of the goals of an RF transistor amplifier designer may be to keep the size of the transistor amplifier small. Adding gaps such as the gaps 172 between groups 170 of unit cell transistors 160 is inconsistent with such a goal, and hence non-intuitive. Moreover, were an RF transistor amplifier designer to ascertain that mutual coupling between unit cell transistors 160 was problematic and further determine that increased distances and/or isolation structures should be used to reduce such mutual coupling, the designer would be led to increase the distance between individual unit cell transistors 160 and/or to provide isolation structures between the unit cell transistors 160, not to keep the distance between most of the unit cell transistors 160 the same while providing larger gaps 172 and/or isolation structures 180 between groups 170 of the unit cell transistors 160 as is done in the embodiment of FIGS. 2A-2F above.

Another advantage of arranging the unit cell transistors 160 into groups 170 that are separated by gaps 172 is that the density of the unit cell transistors 160 is reduced. Heat build-up may be a problem in multi-cell transistors such as RF transistor amplifiers, and if too much heat is allowed to build-up in the device, the performance of the device may be degraded. The gaps 172 provide additional area for heat dissipation, and hence may improve the thermal performance of the multi-cell transistor 100.

The above-described multi-cell transistor 100 includes a semiconductor structure 110 and a plurality of unit cell transistors 160 that are electrically connected in parallel, where each unit cell transistor 160 extends in a first direction in the semiconductor structure 110. The unit cell transistors 160 are spaced apart from each other along a second direction and arranged in a plurality of groups 170, where a first distance in the second direction between like fingers 130, 140, 150 of two adjacent unit cell transistors 160 in a first of the groups 170 is less than a second distance in the second direction between like fingers 130, 140, 150 of a first unit cell transistor 160 that is at one end of the first of the groups 170 and a second unit cell transistor 160 that is in a second of the groups 170, where the second unit cell transistor 160 is adjacent the first unit cell transistor 160. The like fingers may be gate fingers 130 in some embodiments, source fingers 140 in other embodiments, and drain fingers 150 in still other embodiments. For example, first and second unit cell transistors 160 may be in the first group 170 and may be adjacent each other, and a third unit cell transistor 160 may be in a second group 170 and may be adjacent the second unit cell transistor 160. The source fingers 140 of the first and second unit cell transistors 160 may be spaced apart by first distance and the source fingers 140 of the second and third unit cell transistors 160 may be spaced apart by a second distance that is larger than the first distance.

Figure 3A:
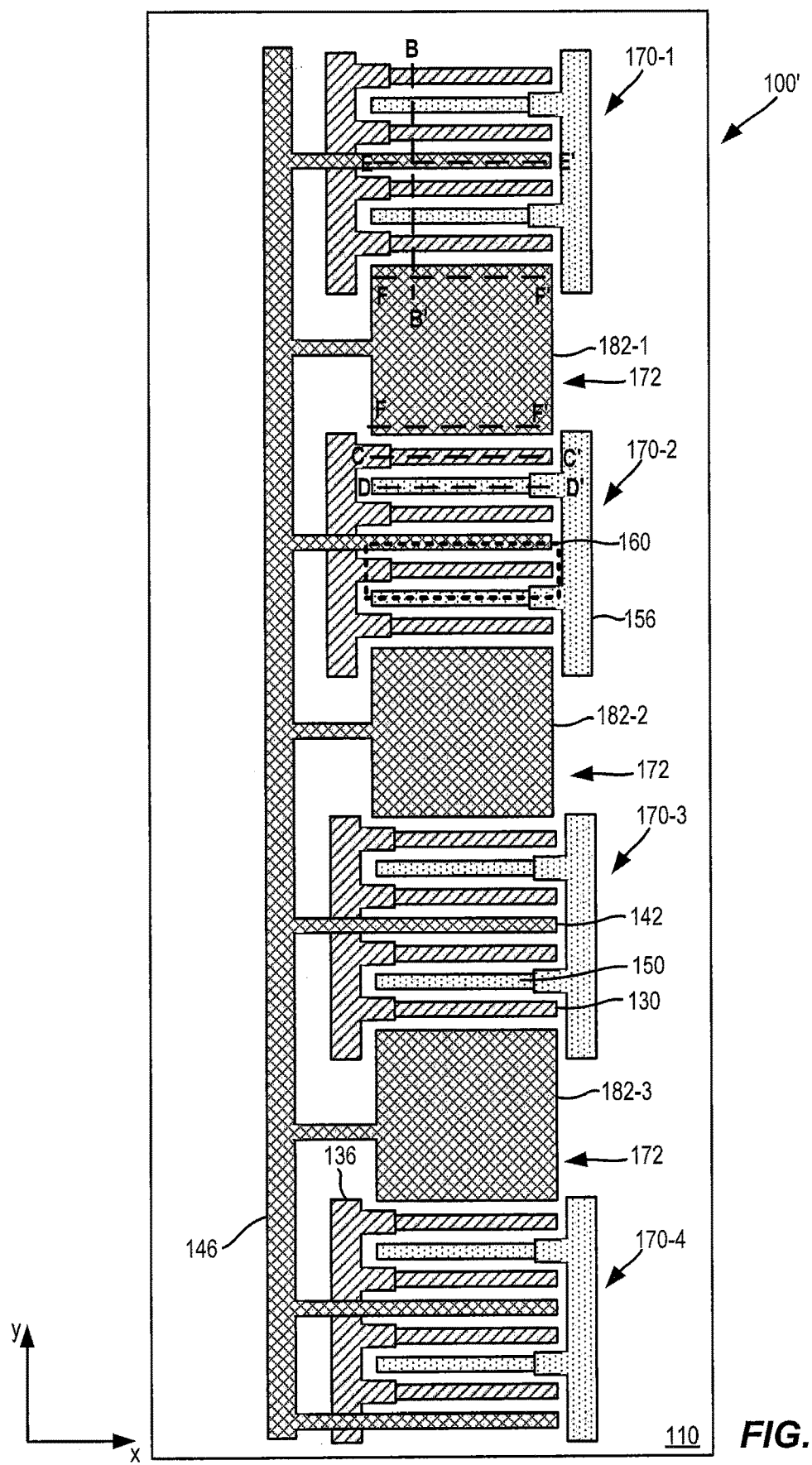
FIG. 3A is a plan view of a modified version of the multi-cell transistor of FIGS. 2A-2F.
Figure 3B:
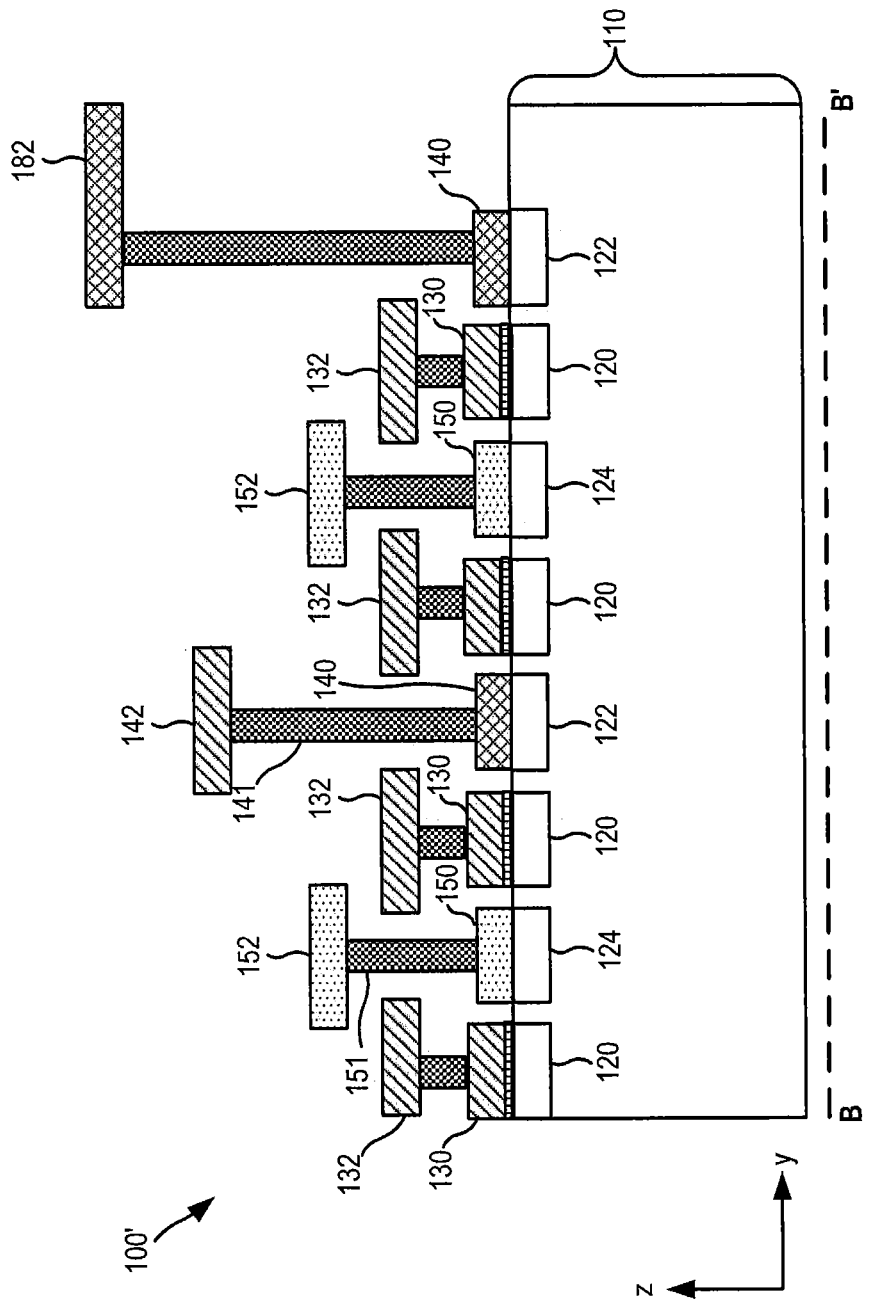
FIG. 3B is a cross-sectional view taken along line B-B' of FIG. 3A.

FIGS. 3A and 3B are a schematic plan view and a schematic cross-sectional view, respectively, illustrating a multi-cell transistor 100' that is a modified version of the multi-cell transistor 100 of FIGS. 2A-2F. The cross-section of FIG. 3B is taken along line B-B' of FIG. 3A. Cross-sections taken along lines C-C', D-D', E-E' and F-F' of FIG. 3A may be identical to what is shown in FIGS. 2B, 2C, 2D and 2E, respectively (with the exception that the conductive vias 184 in FIG. 2E are taller in the transistor 100'), and hence those cross-sections are not repeated here.

In the multi-cell transistor 100' of FIGS. 3A and 3B, the source contact structures are all formed on the upper side of the semiconductor structure 110, instead of having a source contact on the bottom side of the semiconductor structure 110 that is electrically connected to the source regions 122 via conductive vias as is the case with multi-cell transistor 100. As shown in FIG. 3A, in the depicted embodiment a source mandrel 146 is provided at a higher level above the semiconductor structure 110 than the gate mandrel 136. The source fingers 140 may be connected to the source mandrel 146 by conductive vias 141 and source runners 142. As is shown in FIG. 3B, the metal pads 182 may be at a higher level above the semiconductor structure 110 than the source runners 142 in some embodiments. This may help improve the amount of isolation provided by the isolation structures 180.

Figure 4A:
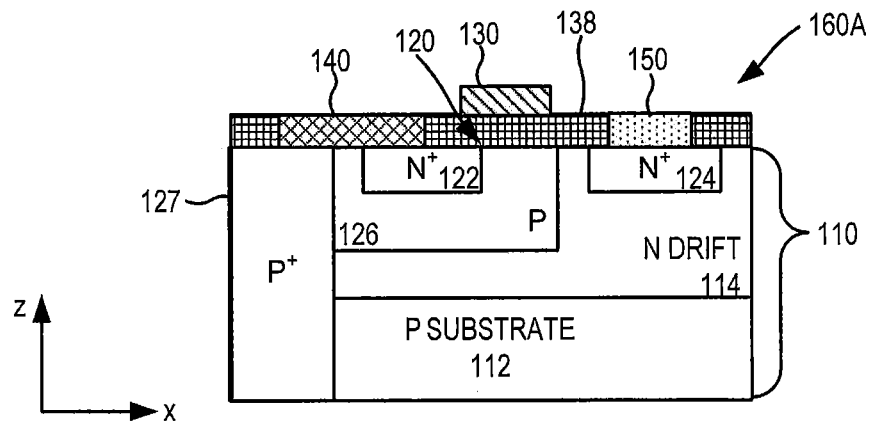
FIG. 4A is a cross-sectional view of a unit cell of a laterally diffused metal oxide semiconductor (LDMOS) transistor that represents one possible semiconductor structure for the multi-cell transistor of FIGS. 2A-2F.
Figure 4B:
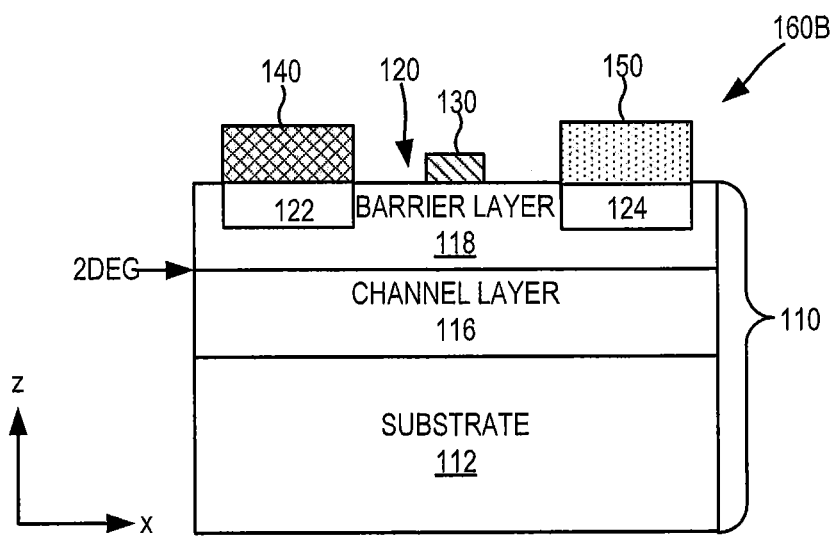
FIG. 4B is a cross-sectional view of a unit cell of a high-electron-mobility transistor (HEMT) that represents another possible semiconductor structure for the multi-cell transistor of FIGS. 2A-2F.

The discussion above with respect to FIGS. 2A-2F and FIGS. 3A-3B focuses on the contact structures for transistors 100, 100' as opposed to the specific type of unit cell transistor design. Thus, in the discussion above, the semiconductor structure 110 is treated generically. It will be appreciated that a variety of different types of unit cell transistors 160 may be used to form the transistors 100 and 100'. FIGS. 4A and 4B illustrate example unit cell transistor designs that may be used to form different embodiments of transistors 100 and 100'. While FIGS. 4A-4B illustrate examples where laterally diffused metal oxide semiconductor (LDMOS) transistor field effect transistors (FET) and/or high electron mobility transistors are formed in the semiconductor structure 110, it will be appreciated that these implementations are provided as examples only.

Referring first to FIG. 4A, an example embodiment is illustrated where the transistor 100 (or the transistor 100') is implemented using LDMOS unit cell transistors 160A. The cross-section shown in FIG. 4A is taken along a central portion of the line F-F' of FIG. 2A. To simplify the drawings, structures above the gate, source and drain fingers 130, 140, 150 are omitted in FIG. 4A.

As shown in FIG. 4A, the semiconductor structure 110 includes a substrate 112 and a drift layer 114 (e.g., having n-type conductivity) on the substrate 112. The substrate 112 may comprise a semiconductor substrate such as, for example, an aluminum nitride, aluminum gallium nitride, gallium nitride, silicon, silicon carbide, GaAs, LGO, ZnO, LAO, or InP that has, in this embodiment, p-type conductivity. Alternatively, the substrate 112 may be a non-semiconductor substrate such as, for example, a sapphire or diamond substrate that has, in this embodiment, a p-type conductivity semiconductor epitaxial layer formed on an upper surface thereof. A doped well region 126 (e.g., having p-type conductivity) is formed in the drift layer 114. A source region 122 is formed in an upper portion of the well region 126, and a drain region 124 is formed in an upper portion of the well region 126. The source and drain regions 122, 124 may have, for example, n-type conductivity. The drain region 124 may extend underneath one of the drain fingers 150. A channel region 120 is also provided in an upper portion of the semiconductor structure 110 between the source region 122 and the drain region 124. The channel region 120 may extend underneath one of the gate fingers 130 on top of a gate insulating layer 138 such as, for example, a silicon oxide layer or other insulating oxide layer. The source region 122 may be electrically connected to a source contact (not shown) that is provided on a bottom or ("back") side of the substrate 112 via a laterally diffused, low-resistance p+"sinker" 127.

The LDMOS unit cell transistor 160A of FIG. 4A may be operated by applying appropriate voltages to the gate finger 130, source finger 140 and drain finger 150 in order to turn the LDMOS unit cell transistor 160A on and off and/or to control the amount of current flowing between the source finger 140 and the drain finger 150. For example, applying a positive voltage to the gate finger 130 with respect to the source finger 140 may provide for a current to flow between the source region 122 and the drain region 124 by forming an inversion layer (e.g., a channel) between the source region 122 and the drain region 124. LDMOS FETs may operate in "enhancement mode," meaning the drain-source current may not flow until an applied positive gate voltage enhances a channel across the well region 126.

Referring next to FIG. 4B, an example embodiment is illustrated where the unit cell transistors of multi-cell transistor 100 are implemented as HEMT unit cell transistors 160B. The cross-section shown in FIG. 4B is taken along a central portion of the line F-F' of FIG. 2A. To simplify the drawings, structures above the gate, source and drain fingers 130, 140, 150 are omitted in FIG. 4B.

As shown in FIG. 4B, the semiconductor structure 110 includes a substrate 112 and an epitaxial structure that is formed on the substrate 112. The substrate 112 may comprise a semiconductor substrate such as, for example, an aluminum nitride, aluminum gallium nitride, gallium nitride, silicon, silicon carbide, GaAs, LGO, ZnO, LAO, or InP substrate. Alternatively, the substrate 112 may be a non-semiconductor substrate such as, for example, a sapphire or diamond substrate that has a semiconductor epitaxial layer formed on an upper surface thereof. The epitaxial structure may include a channel layer 116 that is formed on the substrate 112, and a barrier layer 118 that is formed on the channel layer 116 opposite the substrate 112. The channel layer 116 and the barrier layer 118 may include Group III-nitride based materials, with the material of the barrier layer 118 having a higher bandgap than the material of the channel layer 116. For example, the channel layer 116 may comprise GaN, while the barrier layer 118 may comprise AlGaN. While the channel layer 116 and the barrier layer 118 are illustrated as single layer structures, it will be appreciated that either or both the channel layer 116 and/or the barrier layer 118 may be implemented as multi-layer structures. It will also be appreciated that additional layers such as, for example, buffer layers, strain-balancing layers, transition layers and the like may also be included as part of the epitaxial structure provided on the substrate 112.

Source and drain regions 122, 124 are provided in the barrier layer 118. The source region 122 may extend underneath one of the source fingers 140, and the drain region 124 may extend underneath one of the drain fingers 150. A channel region 120 may be provided in an upper portion of the semiconductor structure 110 between the source region 122 and the drain region 124. The channel region 120 may extend underneath one of the gate fingers 130.

Due to the difference in bandgap between the barrier layer 118 and the channel layer 116 and piezoelectric effects at the interface between the barrier layer 118 and the channel layer 116, a two dimensional electron gas (2DEG) is induced in the channel layer 116 at a junction between the channel layer 116 and the barrier layer 118. The 2DEG acts as a highly conductive layer that allows conduction between the source and drain regions 122, 124.

The LDMOS and HEMT devices 160A, 160B of FIGS. 4A and 4B are included as examples for possible configurations of a unit cell transistor 160. However, it will be understood that other unit cell transistor configurations could be utilized with the present invention without deviating from the scope of the embodiments described herein. For example, any configuration of a unit cell transistor 160 that may be combined with other unit cell transistors using a gate finger and/or drain finger may benefit from the techniques described herein. As such, the present invention is not limited to HEMT and LDMOS unit cell transistors.

As discussed above, one technique for increasing the effective gate periphery of a transistor is to increase the number of unit cell transistors that are connected in parallel. Another technique is increasing the width of the gate fingers of each unit cell transistor. As is also discussed above, the '571 application describes techniques for increasing the width of the gate fingers of a multi-cell transistor while reducing or minimizing the performance degradations that may result from such an increase in the width of the gate fingers. In particular, the '571 application discloses techniques for feeding the gate fingers of a multi-cell transistor from interior positions along the gate fingers.

One potential problem that may arise when the width of the gate fingers in a multi-cell transistor is increased is that the phase of a gate signal applied to a first end of a gate finger may be significantly different from the phase of the gate signal at the other end of the gate finger, due to the change in phase that occurs as the gate signal propagates across the full width of the gate finger. As the width of a gate finger is increased, the phase difference in the gate signal is also increased. This phase difference in the gate signal will be reflected in the drain signal, and the phase difference in the drain signal will result in different portions of the drain current not being summed fully in-phase, causing a degradation in the total output current magnitude and consequently, in the output power of the transistor. Additionally, the out-of-phase current combining may affect the time-domain output current waveform shape, and may impact the transistor efficiency, which is another key specification for a power amplifier. See, e.g., S. C. Cripps, "RF Power Amplifiers for Wireless Communications," Artech House, 2006. The non-uniform phase phenomenon may also be present when gate fingers having smaller widths are used, but to a smaller degree.

As explained in the '571 application, by feeding the gate signal to the gate fingers at interior positions, such as at midpoints of the gate fingers, large phase differences that can occur due to the gate signal propagating across the full length of a wide gate finger may be reduced. The '571 application proposes adding gate interconnects that extend at a different level in the device above the semiconductor structure that are used to feed the gate signals to the gate runners at interior positions along the gate runners. The net effect of this approach is that the gate signals may be fed to the gate fingers from interior positions along the gate fingers, which reduces the total amount of phase change that occurs as the gate signals propagate along the gate fingers.

The gate signal may split at the point where it is passed from each gate interconnect to a corresponding gate runner, and may propagate along each gate runner in two different directions. The split gate signals pass from each gate runner to corresponding gate fingers. This technique may allow the width of each gate finger to be doubled without increasing the maximum phase difference that will be seen in the gate signal along the full widths of the gate fingers. Thus, by adding gate interconnects and feeding the gate runners at interior positions thereof, the gate periphery of a multi-cell transistor may be increased without phase induced performance degradations. Moreover, the gate interconnects can be made to have a larger cross-sectional area in the y-z plane than the gate runners, which reduces the resistance of the gate interconnects as compared to the resistance of the gate runners. Consequently, an undesirable increase in the gate resistance of the multi-cell transistor may be reduced since the resistance of each gate interconnect may be substantially less than the resistance of the corresponding gate runners.

According to some embodiments, multi-cell transistors having larger gate widths can be provided by adding gate interconnects above each respective gate runner, and using a conductive via to electrically connect each gate interconnect to an interior position on the corresponding gate runner. The connection of each gate interconnect to the interior position of a corresponding gate runner may serve to divide the gate fingers into multiple segments in some embodiments. Likewise, these multi-cell transistors may include drain interconnects above each respective drain runner, and may include conductive vias to electrically connect each drain interconnect to an interior position on each corresponding drain runner.

Figure 5A:
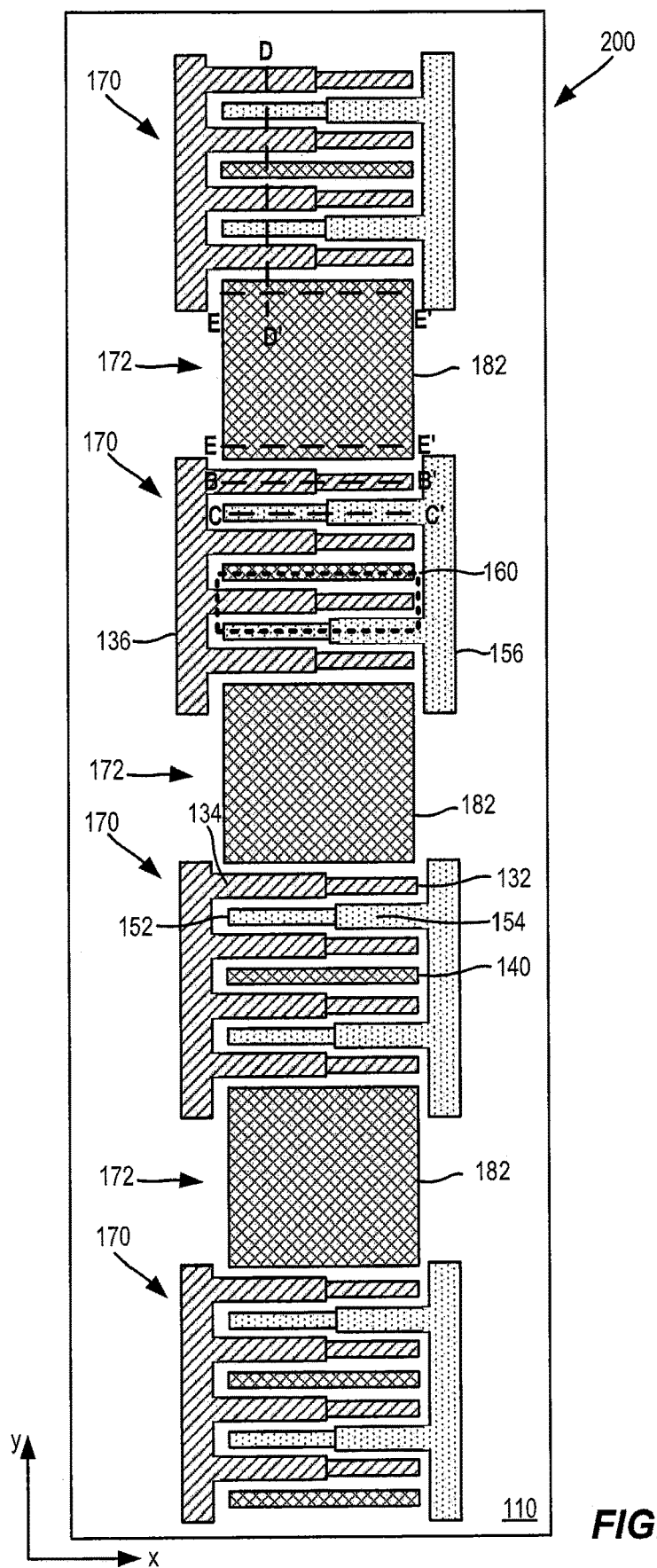
FIG. 5A is a plan view of a multi-cell transistor according to further embodiments of the present invention that includes gate interconnects.
Figure 5B:
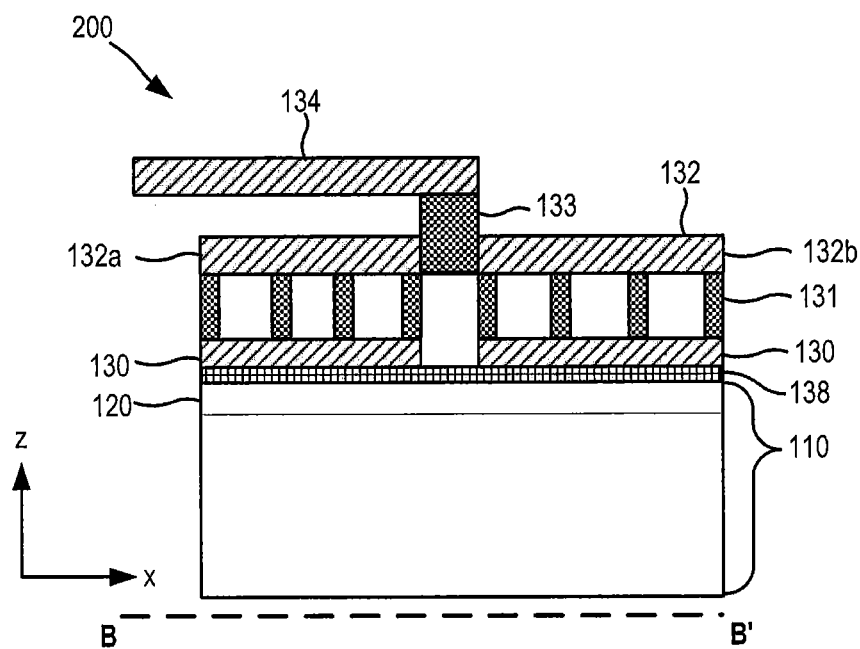
FIGS. 5B-5C are cross-sectional views taken along lines B-B' and C-C' of FIG. 5A, respectively.
Figure 5C:
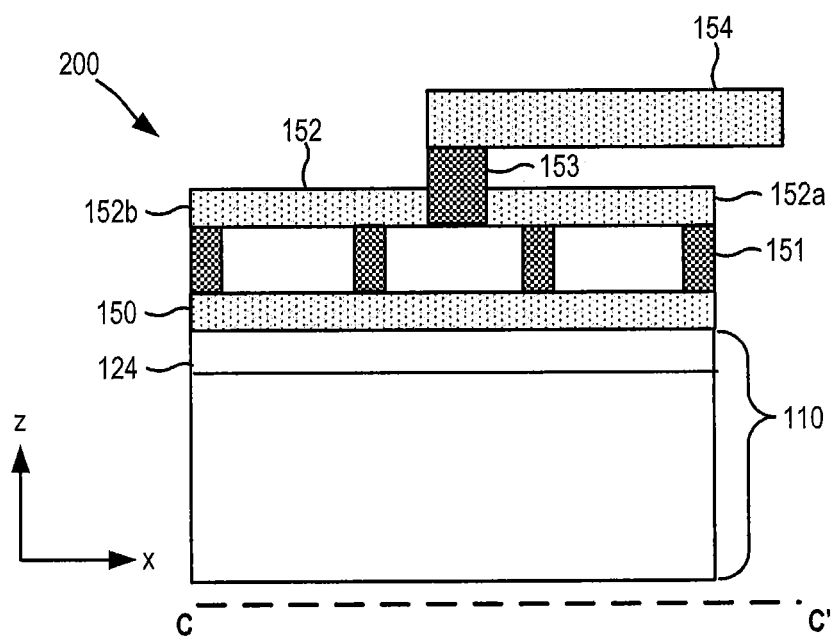

FIGS. 5A-5C illustrate a multi-cell transistor 200 according to embodiments of the present invention that includes gate and drain interconnects that allow increasing the widths of the gate and drain fingers. In particular, FIG. 5A is a schematic plan view of the multi-cell transistor 200, and FIGS. 5B-5C are cross-sectional views taken along lines B-B' and C-C' of FIG. 5A, respectively.

As can be seen by comparing FIGS. 5A-5C to FIGS. 2A-2F, the transistor 200 may be similar to the transistor 100 that is described above. Accordingly, the discussion that follows will focus on the differences between the two transistors 100, 200, and the same reference numerals are used to denote like or similar elements in transistors 100 and 200.

The transistor 200 includes a plurality of unit cell transistors 160 that are repeatedly arranged on a semiconductor structure 110. The unit cell transistors 160 may be any appropriate type of transistor, such as, for example, an LDMOS transistor having the semiconductor structure shown in FIG. 4A or a HEMT transistor having the semiconductor structure shown in FIG. 4B. The unit cell transistors 160 may be electrically connected in parallel to provide a combined output signal. For example, the respective gate regions, drain regions, and source regions of the unit cell transistors 160 may be commonly connected so as to provide a plurality of transistors coupled in parallel Each unit cell transistor 160 includes a channel region 120, a source region 122, and a drain region 124 that are formed in the upper region of a semiconductor structure 110. A gate finger 130 is formed above each channel region 120, a source finger 140 is formed above each source region 122, and a drain finger 150 is formed above each drain region 124. A gate runner 132 is formed above each gate finger 130 and is physically and electrically connected to the respective gate finger 130 by a row of conductive vias 131. A drain runner 152 is formed above each drain finger 150 and is physically and electrically connected to the respective drain finger 150 by a row of conductive vias 151. A source contact (not shown) is formed on the back side of the semiconductor structure 110 and is electrically connected to the source regions 122 by, for example, conductive vias (not shown).

The unit cell transistors 160 are arranged in a plurality of groups 170. Adjacent groups 170 are separated by gaps 172 so that the distance between two adjacent unit cell transistors 160 within a group 170 is less than the distance between an end unit cell transistor 160 of a first group 170 and the closest unit cell transistor 160 in an adjacent group 170. The gaps 172 may extend between source regions 122 for two adjacent unit cell transistors 160 that are part of different ones of the groups 170.

In some embodiments, a metal pad 182 may be provided in each gap 172. Each metal pad 182 may extend on the semiconductor structure 110 above the source regions 122 for the unit cell transistors 160 on either side of the gap 172. Each metal pad 182 may be significantly longer in the second direction (the y-direction) than are the drain fingers 150 and the gate fingers 130. A row of conductive vias 184 physically and electrically connect each end of each metal pad 182 to a respective source region 122. In some embodiments, one or more of the metal pads 182 may be electrically connected to a reference signal (e.g., ground) through the electrical connection to the respective source region 122. The combination of a metal pad 182 and the conductive vias 184 may form an isolation structure 180 between adjacent groups 170 of unit cell transistors 160. The isolation structure 180 may reduce mutual coupling between the adjacent groups 170. The metal pad 182 may be formed at a higher level above the semiconductor structure 110 than are the gate runners 132 and/or the drain runners 152 in order to increase the amount of isolation provided between adjacent groups 170. In some embodiments, the metal pad 182 may have a length in the second direction (the y-direction in FIG. 5A) that is sufficient so that one or more bond wires 186 may be bonded to the metal pad 182, as is discussed above with respect multi-cell transistor 100. The bond wires 186 may also comprise part of the isolation structure 180 and may further reduce mutual coupling between adjacent groups 170 of unit cell transistors 160. It will be appreciated that, in some embodiments, the bond wires 186 may be replaced with other metal shielding structures in other embodiments that are, for example, bonded to the metal pad 182. For example, a bond and/or isolation wall could replace the bond wires 186 in other embodiments.

The multi-cell transistor 200 differs from multi-cell transistor 100 in that multi-cell transistor 200 further include a plurality of gate interconnects 134 and a plurality of drain interconnects 154. In the embodiment of FIGS. 5A-5C, the gate interconnects 134 comprise extensions of the gate mandrel 136, and the drain interconnects 154 comprise extensions of the drain mandrel 156, although other implementations are possible.

As shown in FIGS. 5A and 5B, each gate interconnect 134 extends over a respective one of the gate runners 132, and is electrically connected to the respective gate runner 132 by a conductive via 133. In some embodiments, the gate interconnects 134 may be at a higher level above the semiconductor structure 110 than the gate runners 132. In some embodiments, each gate interconnect 134 may have a greater cross-sectional area in the y-z plane than the gate runners 132. In some embodiments, the gate interconnects 134 may contain metal or other highly conductive material, including, for example, copper, gold, and/or a composite metal.

As shown in FIG. 5B, each conductive via 133 connects a gate interconnect 134 to an interior position of a respective gate runner 132. For example, the gate runner 132 may have first and second opposed ends 132a, 132b. The conductive via 133 may be connected to the gate runner 132 at an interior position that is between the first end 132a and the second end 132b. In some embodiments, the interior position may be at a midpoint of (e.g., halfway between) the first end 132a and the second end 132b of the gate runner 132. In some embodiments, the interior position may be at a distance that is within ten percent of the length of the gate runner 132 from the midpoint thereof. In some embodiments, the interior position may be at a distance that is within twenty percent of the length of the gate runner 132 from the midpoint thereof. In some embodiments, the interior position may be at a distance that is between one-third and two-thirds of the distance between the first end 132a and the second end 132b of the gate runner 132.

As shown in FIG. 5B, in some embodiments, the gate fingers 130 may be formed into a pair of gate finger segments as opposed to being a continuous gate finger 130.

As shown in FIGS. 5A and 5C, each drain interconnect 154 extends over a respective one of the drain runners 152, and is electrically connected to the respective drain runner 152 by a conductive via 153. In some embodiments, the drain interconnects 154 may be at a higher level above the semiconductor structure 110 than the drain runners 152. In some embodiments, each drain interconnect 154 may have a greater cross-sectional area in the y-z plane than the drain runners 152. In some embodiments, the drain interconnects 154 may contain metal or other highly conductive material, including, for example, copper, gold, and/or a composite metal.

As shown in FIG. 5C, each conductive via 153 connects a drain interconnect 154 to an interior position of a respective drain runner 152. For example, the drain runner 152 may have a first and second opposed ends 152a, 152b. The conductive via 153 may be connected to the drain runner 152 at an interior position that is between the first end 152a and the second end 152b. In some embodiments, the interior position may be at a midpoint of (e.g., halfway between) the first end 152a and the second end 152b of the drain runner 152. In some embodiments, the interior position may be at a distance that is within ten percent of the length of the drain runner 152 from the midpoint thereof. In some embodiments, the interior position may be at a distance that is within twenty percent of the length of the drain runner 152 from the midpoint thereof. In some embodiments, the interior position may be at a distance that is between one-third and two-thirds of the distance between the first end 152a and the second end 152b of the drain runner 152.

In the multi-cell transistor 200, the gate signal may be fed to each gate runner 132 at an interior (e.g., middle) portion thereof, providing a symmetric feed to the two segments of the corresponding gate fingers 130. A similar configuration may also be implemented for the drain side (e.g., for drain fingers 150 and the drain runners 152). This approach may reduce the phase change that the gate and drain signals experience when traversing the respective gate and drain fingers while allowing for increased output power levels. Additionally, since the multi-cell transistor 200 arranges the unit cell transistors 160 thereof into a plurality of groups 170 that are separated by gaps 172 that include isolation structures 180, the mutual coupling between adjacent groups 170 may be decreased, and the total number of unit cell transistors included in the multi-cell transistor 200 may be increased accordingly without significant degradation in performance. This increase in the number of unit cell transistors 160 may further increase the output power of the multi-cell transistor 200.

It will be appreciated that many variations may be made to the above-disclosed examples of multi-cell transistors according to embodiments of the present invention. For example, the multi-cell transistors may have any number of groups of unit cell transistors. Each group may have any number of unit cell transistors. Thus, all of the groups may have the same number of unit cell transistors, all of the groups may have different numbers of unit cell transistors, or some groups may have the same number of unit cell transistors and other groups may have different numbers of unit cell transistors. In an example embodiment, the multi-cell transistor may have five groups of unit cell transistors, with two of the groups having eight unit cell transistors, two other of the groups having twelve unit cell transistors, and another group having twenty unit cell transistors.

It will likewise be appreciated that the spacing between unit cell transistors in each group may be the same or different. Thus, all of the unit cell transistors in a group may be spaced apart from adjacent unit cell transistors by the same distance, all may be spaced apart from adjacent unit cell transistors by different distances, or subsets of the unit cell transistors in a group can be spaced apart by a variety of different distances. The unit cell transistors in different groups may be spaced apart by the same distances or by different distances. It will further be appreciated that the sizes of the gaps between groups may be the same or may be different. Thus, all of the gaps may be the same size (i.e., have the same length in the y-direction), all of the gaps may have different sizes, or some gaps may have the same size or sizes, while others have different sizes.

Figure 6A:
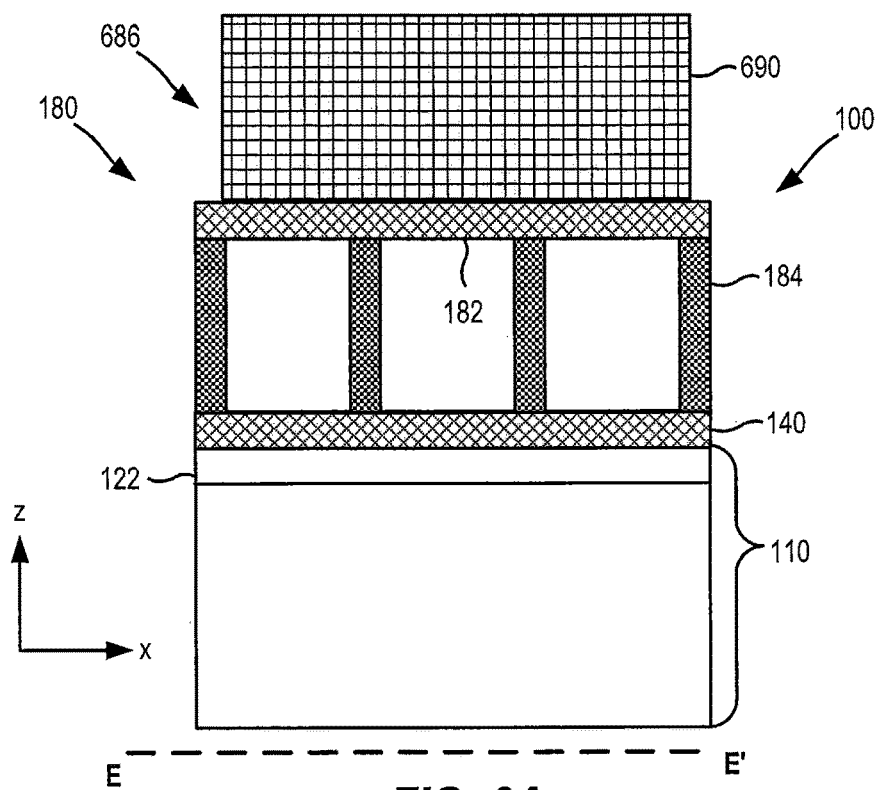
FIGS. 6A-6D are cross-sections taken along line E-E' of FIG. 2A that illustrate an embodiment of an isolation structure including a wall structure.

FIGS. 6A-6D are cross-sections taken along line E-E' of FIG. 2A that illustrate an embodiment of an isolation structure comprising a wall structure. In FIGS. 6A-6D, the multi-cell transistor 100 may include elements similar to those described herein with respect to FIG. 2A-2F. Accordingly, the discussion that follows will focus on the additional elements in the embodiments of FIGS. 6A-6D, and the same reference numerals are used to denote like or similar elements. As noted with respect to the discussion of FIG. 2E, in some embodiments, the bond wires 186 of FIG. 2E may be replaced and/or with a wall or similar structure which provides additional isolation. In some embodiments, the wall or similar structure may be composed of metal or metal-containing materials. For example, as illustrated in FIG. 6A, a wall structure 686 may be formed on a metal pad 182 of the isolation structure 180, and may include a segment of isolation material 690. The wall structure 686 may extend in the first direction (the x-direction in FIG. 6A) between adjacent groups 170 of unit cell transistors 160. In some embodiments, a bottom portion of the segment of isolation material 690 may be bonded and/or otherwise electrically connected to the top surface of the metal pad 182. In some embodiments, the segment of isolation material 690 may have a width in the first direction (the x-direction) that is substantially the same as, or smaller than, the width of the metal pad 182 in the first direction, though the present invention is not limited thereto. In some embodiments, the segment of isolation material 690 may have a width in the first direction (the x-direction) that is at least half the width of the metal pad 182 in the first direction.

The wall structure 686 may reduce a mutual coupling (e.g., capacitive and/or magnetic coupling) between adjacent groups 170 of unit cell transistors 160 of the multi-cell transistor 100. In some embodiments, the isolation material 690 of the wall structure 686 may be configured to provide an electromagnetic shield between adjacent groups 170 of unit cell transistors 160 of the multi-cell transistor 100.

In some embodiments, the isolation material 690 may be constructed of a conductive material so as to form a conductive isolation material 690. The conductive isolation material 690 may be coupled to a reference voltage source (e.g., ground) through the metal pad 182. In some embodiments, the isolation material 690 may be provided so as to be electrically floating as opposed to being coupled to ground. In such embodiments, the isolation material 690 may not be electrically connected to the metal pad 182. In some embodiments, the isolation material 690 may include a metal, a conductive metal nitride, a conductive metal oxide, or a combination of the above materials. For example, the isolation material 690 may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, the isolation material 690 may include non-conductive material plated and/or coated with a conductive material (e.g., a metal or metal-containing substance).

Though the isolation material 690 may be a conductive isolation material, the present invention is not limited thereto. In some embodiments, the isolation material 690 may include dielectric material capable of absorbing microwave and/or RF emissions. In some embodiments the isolation material 690 may be formed of a lossy dielectric. The lossy dielectric may be configured to absorb and/or reduce electromagnetic waves such as those which provide the coupling between adjacent groups 170 of unit cell transistors 160. Lossy dielectrics which may be useful as materials in the isolation material 690 may include lossy dielectrics having a loss tangent greater than 0.1. The loss tangent, also known as tan δ, is a ratio between the real and imaginary parts of the dielectric permittivity. In some embodiments, the loss tangent for the lossy dielectric being used as the isolation material 690 may be based on the operating frequency of the multi-cell transistor 100. Examples of lossy dielectrics may include dielectrics containing carbon.

In some embodiments, the isolation material 690 may include a magnetic material, such as, for example, ferrite and/or nickel.

In some embodiments, the segment of isolation material 690 may be provided to extend from a surface of the multi-cell transistor 100. For example, the multi-cell transistor 100 may be formed, including the semiconductor structure 110, the gate/drain fingers, the gate/drain runners, and the isolation structure 180, as described herein, and may be covered with a protection and/or passivation layer. In some embodiments, the protection and/or passivation may be configured and/or recessed to expose a top surface of the metal pad 182 of the isolation structure 180, and the isolation material 690 of the wall structure 686 may be coupled thereto. Thus, in some embodiments, the wall structure 686 may be formed and/or placed on the multi-cell transistor 100 after the multi-cell transistor is placed within a package to form packaged transistor device.

Figure 6B:
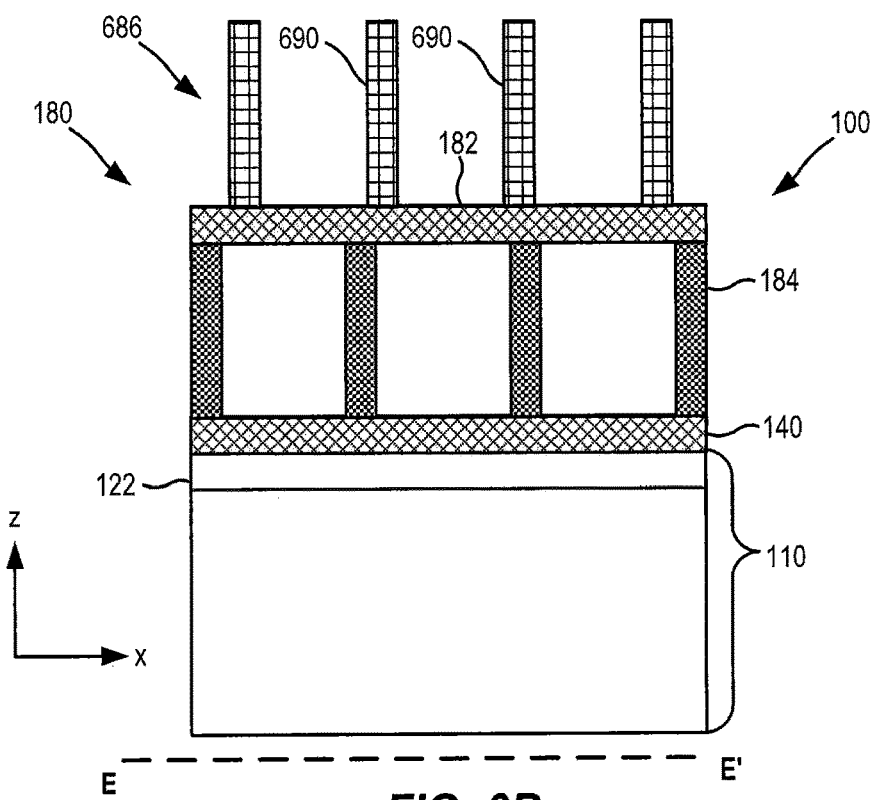

Though FIG. 6A illustrates a single segment of isolation material 690, other configurations are possible. For example, FIG. 6B illustrates a configuration in which the wall structure 686 is comprised of multiple segments of isolation material 690. In some embodiments, the plurality of segments of isolation material 690 may extend away from the top surface of the metal pad 182 in a direction away from the metal pad 182 (e.g., in a z direction in FIG. 6B). In some embodiments, the plurality of segments of isolation material 690 may extend in a direction that is substantially perpendicular to the top surface of the metal pad 182. Respective ones of the segments of isolation material 690 may be bonded and/or otherwise electrically connected to the top surface of the metal pad 182. In some embodiments, the segments of isolation material 690 may include a metal, a conductive metal nitride, a conductive metal oxide, or a combination of the above materials. For example, the segments of isolation material 690 may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, the segments of isolation material 690 may include a lossy dielectric and/or magnetic material. In some embodiments, ones of the segments of isolation material 690 may include a material different from other ones of the segments of isolation material 690.

Figure 6C:
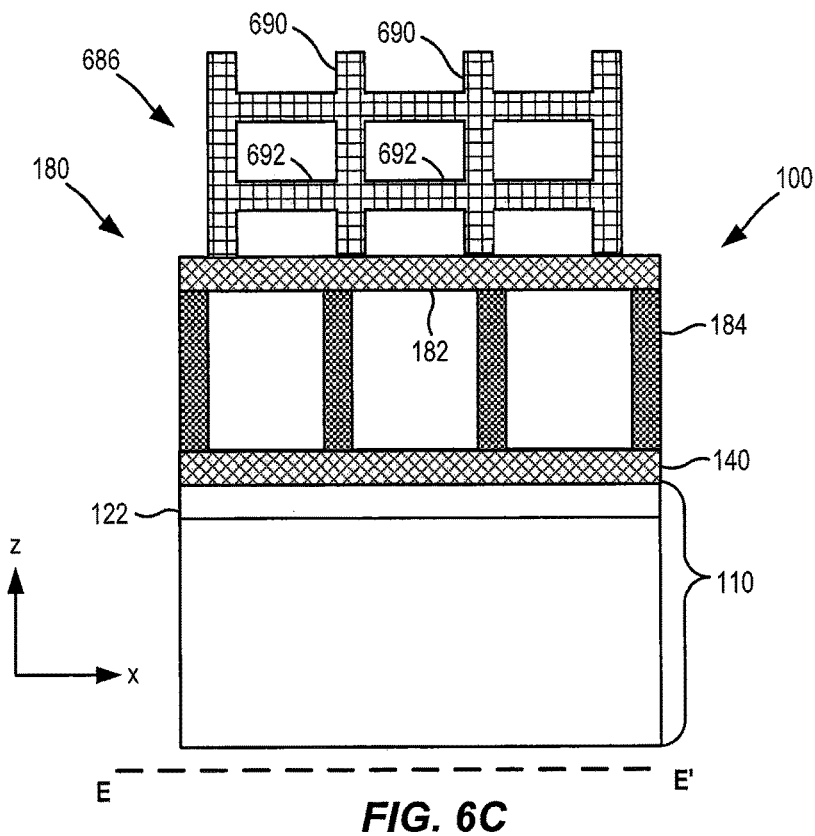

FIG. 6C is a cross-sectional view that illustrates a configuration in which the wall structure 686 is comprised of multiple segments of isolation material 690 that are interconnected. As illustrated in FIG. 6C, respective ones of the vertically-extending segments of isolation material 690 may be interconnected with one or more connecting segments of isolation material 692. As with the embodiment illustrated in FIG. 6B, the vertically-extending segments of isolation material 690 may be bonded and/or electrically connected to a top surface of the metal pad 182. In some embodiments, the connecting segments of isolation material 692 may extend substantially horizontally (e.g., in the x-direction) to connect ones of the segments of isolation material 690. In some embodiments, the segments of isolation material 690 and the connecting segments of isolation material 692 may form a mesh, though the present invention is not limited thereto. In some embodiments, the connecting segments of isolation material 692 may include a metal, a conductive metal nitride, a conductive metal oxide, or a combination of the above materials. For example, the segments of isolation material 692 may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, the connecting segments of isolation material 692 may include a lossy dielectric and/or magnetic material. In some embodiments, the connecting segments of isolation material 692 may include a material different from the segments of isolation material 690.

Figure 6D:
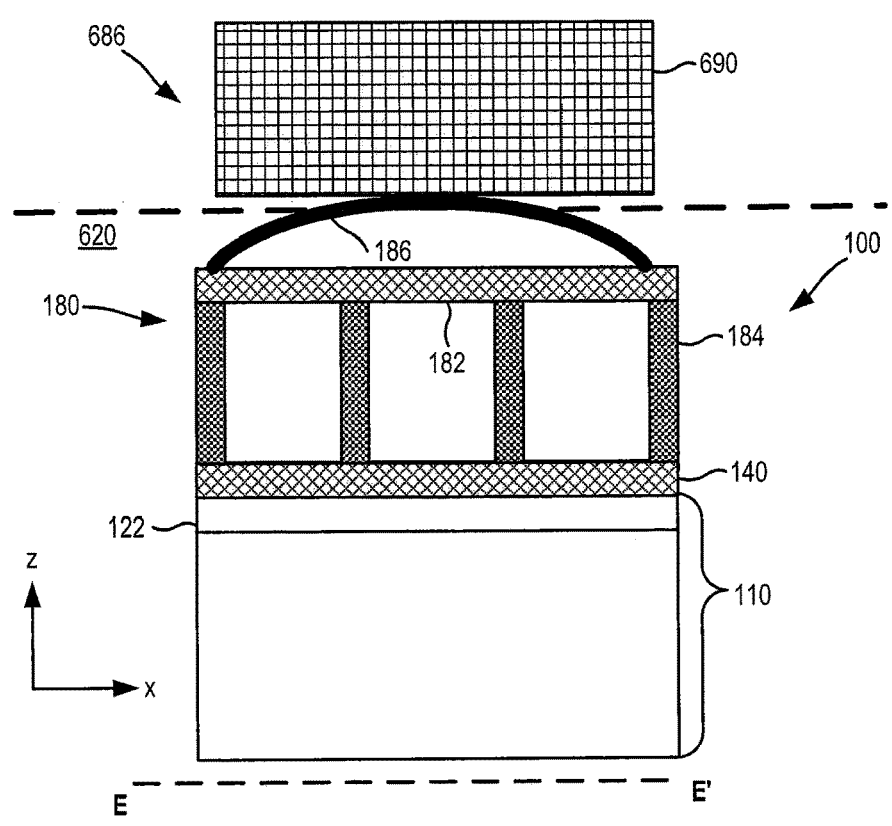

FIG. 6D is a cross-sectional view that illustrates an embodiment in which the wall structure 686 is connected to a bond wire 186. In some embodiments, the bond wire 186 may be coupled to the metal pad 182 of the of the isolation structure 180, and the wall structure 686 may be coupled to the bond wire 186. In some embodiments, the wall structure 686 may be provided with an electrical connection to a ground signal through the bond wire 186 and the isolation structure 180.

In some embodiments, the bond wire 186 may be coupled to the metal pad 182 of the isolation structure 180 as discussed herein with respect to FIG. 2E. Subsequently, the multi-cell transistor 100, including the semiconductor structure 110, gate/drain fingers, gate/drain runners, the isolation structure 180, and/or the bond wire 186, as described herein, may be covered with a protection and/or passivation layer (e.g., passivation layer 620 illustrated in FIG. 6D). The protection and/or passivation layer 620 may be configured and/or recessed to expose the bond wire 186, and the isolation material 690 of the wall structure 686 may be coupled thereto. In some embodiments, the bond wire 186 may be electrically connected to the metal pad 182 after the passivation and/or protection layer 620 is deposited. For example, the passivation and/or protection layer 620 may be deposited on the metal pad 182, and the passivation and/or protection layer 620 may be subsequently recessed to expose the metal pad 182. The bond wire 186 may then be coupled to the metal pad 182, and the wall structure 686 may be subsequently connected to the bond wire 186.

Though FIG. 6D illustrates that the wall structure 686 comprises a single segment of isolation material 690 connected to the bond wire 186, it will be understood that other formations of wall structures 686, such as those illustrated in FIGS. 6B and 6C may be used without deviating from the invention described herein.

Figure 7A:
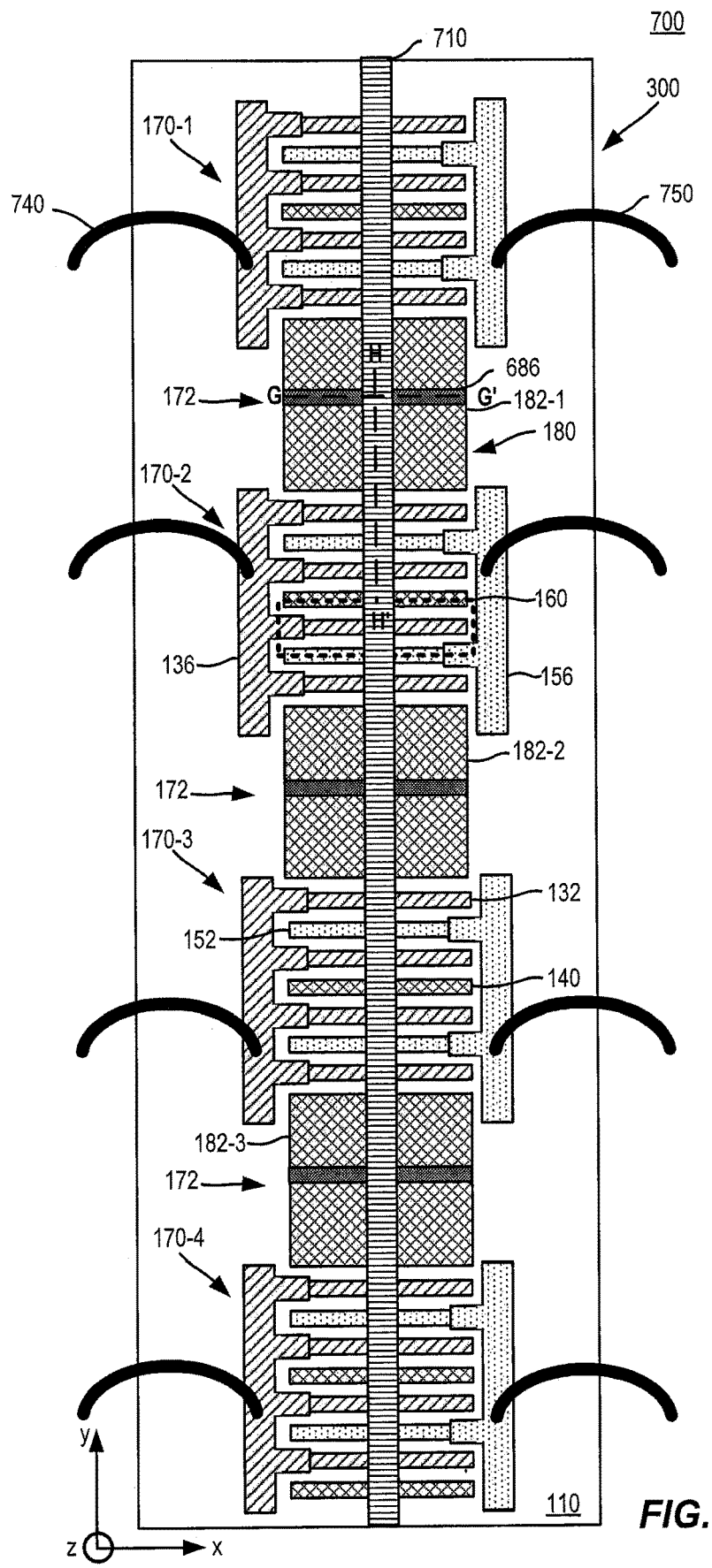
FIG. 7A is a plan view of a multi-cell transistor according to further embodiments of the present invention that includes additional isolation between the input and output bonds of the multi-cell transistor.
Figure 7B:
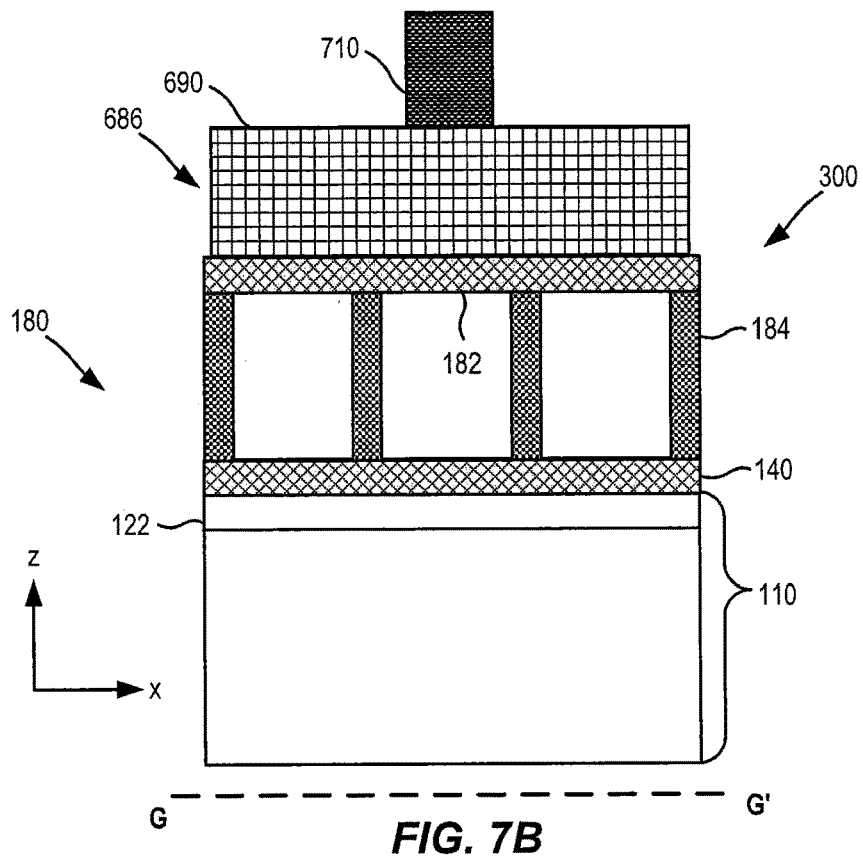
FIGS. 7B and 7C are cross-sectional views taken along lines G-G' and H-H' of FIG. 7A, respectively.
Figure 7C:
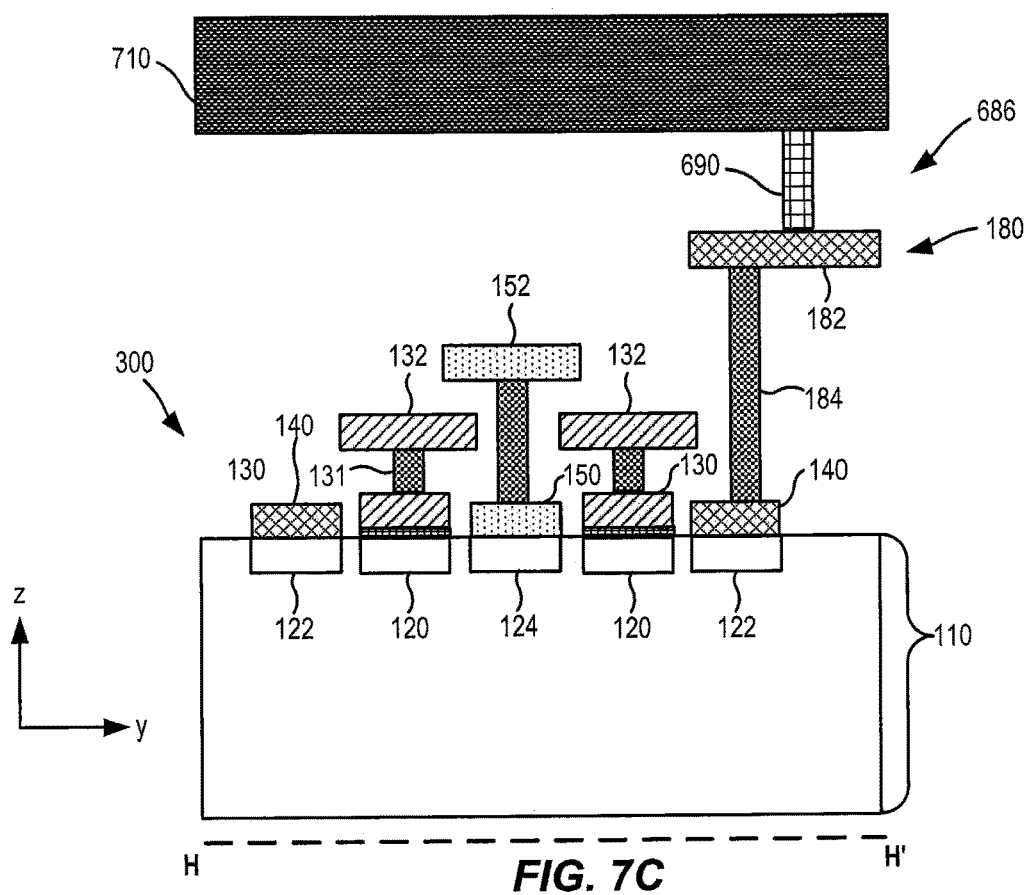

FIG. 7A is a plan view of a packaged transistor device 700 including a multi-cell transistor 300 according to further embodiments of the present invention that includes additional isolation between the input and output bonds of the multi-cell transistor 300. FIGS. 7B and 7C are cross-sectional views taken along lines G-G' and H-H' of FIG. 7A, respectively. FIGS. 7A-7C include structures similar to those discussed with respect to FIGS. 2A-2C and FIGS. 5A-5C. Similar reference numbers in FIGS. 7A-7C refer to identical or similar structures as those discussed with respect to FIGS. 2A-2C and FIGS. 5A-5C, and a repetitive discussion thereof will be omitted.

Referring to FIG. 7A, the packaged transistor device 700 may include a multi-cell transistor 300 with input bond wires 740 and output bond wires 750. The input bond wires 740 may connect to input terminals of the multi-cell transistor device 300. The output bond wires 750 may connect to output terminals of the multi-cell transistor device 300. In some embodiments, the input bond wires 740 may be connected to a gate mandrel 136 to provide a gate signal to the multi-cell transistor device 300 of the packaged transistor device 700. In some embodiments, the output bond wires 750 may be connected to a drain mandrel 156 to provide an output signal from the packaged transistor device 700. At least one of the input bond wires 740 and/or the output bond wires 750 may extend above a top surface of the multi-cell transistor 300 (e.g., in a z direction in FIG. 7A).

The configuration of the input bond wires 740 and the output bond wires 750 are merely an example, and other configurations and connections of the input bond wires 740 and the output bond wires 750 are possible without deviating from the present invention.

Due, in part, to the proximity of the input bond wires 740 and the output bond wires 750, a mutual coupling (e.g., a magnetic and/or capacitive coupling) may be formed between the input bond wires 740 and the output bond wires 750. Such a coupling may degrade the performance of the multi-cell transistor device 300. Coupling between input and output bonds of a transistor devices, and configurations to address such couplings, are discussed in co-pending and commonly-assigned U.S. patent application Ser. No. 16/208,821, filed on Dec. 4, 2018 entitled "PACKAGED TRANSISTOR DEVICES WITH INPUT-OUTPUT ISOLATION AND METHODS OF FORMING PACKAGED TRANSISTOR DEVICES WITH INPUT-OUTPUT ISOLATION," the entire contents of which are incorporated herein by reference. As discussed in that application, an isolation material may be placed between the input bond wires and the output bond wires to minimize coupling therebetween.

Referring to FIG. 7A, embodiments of the invention may insert a secondary isolation material (and/or structure) 710 between the input bond wires 740 that are connected to an input of the multi-cell transistor 300 and the output bond wires 750 that are connected to an output of the multi-cell transistor 300. The secondary isolation material 710 may extend on a top surface of the multi-cell transistor 300, and at least a portion of the secondary isolation material 710 may be physically between the input bond wires 740 and the output bond wires 750 (e.g., above the multi-cell transistor 300). As used herein, a first element is physically between a second element and a third element when a straight line from a portion of the second element to a portion of the third element would intersect the first element. The secondary isolation material 710 may reduce a capacitive and/or magnetic coupling between the input bond wire(s) 740 and the output bond wire(s) 750. In some embodiments, the secondary isolation material 710 may be configured to provide an electromagnetic shield between the input bond wires 740 and the output bond wires 750.

The secondary isolation material 710 may extend in a first direction (e.g., a y direction in FIG. 7A) that is substantially orthogonal to the input bond wires 740 and/or the output bond wires 750 which are connected to the multi-cell transistor 300. The secondary isolation material 710 may extend in the first direction (e.g., the y direction in FIG. 7A) that is substantially orthogonal to a direction in which the wall structure 686 extends (e.g., the x direction in FIG. 7A). The control terminal of the multi-cell transistor 300 (e.g. the gate terminal) may be on a first side of the multi-cell transistor 300 and the output terminal (e.g., the drain terminal) may be on a second side of the multi-cell transistor 300, opposite the first side. The input bond wires 740 may be connected to the input terminal of the multi-cell transistor 300 on the first side. The output bond wires 750 may be connected to the output terminal of the multi-cell transistor 300 on the second side. The secondary isolation material 710 may extend in a plane between the first side and the second side.

In some embodiments, the secondary isolation material 710 may be constructed of a conductive material so as to form a conductive secondary isolation material 710. The conductive secondary isolation material 710 may be coupled to a reference voltage source (e.g., ground). In some embodiments, the secondary isolation material 710 may be coupled to ground via the wall structure 686. For example, as illustrated in FIGS. 7B and 7C, the secondary isolation material 710 may be electrically connected to the isolation material 690 of the wall structure 686. In some embodiments, the wall structure 686 may extend from the metal pad 182 of the isolation structure 180 to contact (or otherwise be electrically connected to) the secondary isolation material 710. In this way, the secondary isolation material 710 may be connected to the reference signal (e.g., ground) through the isolation structure 180. Though the wall structure 686 is illustrated as being in the center of the metal pad 182 in FIG. 7A, it will be understood that this is merely an example. In some embodiments, the wall structure 686 may be disposed closer to one side of the metal pad 182.

In some embodiments, the secondary isolation material 710 may include a metal, a conductive metal nitride, a conductive metal oxide, or a combination of the above materials. For example, the secondary isolation material 710 may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, the secondary isolation material 710 may include non-conductive material plated and/or coated with a conductive material (e.g., a metal or metal-containing substance).

Though the secondary isolation material 710 may be a conductive isolation material, the present invention is not limited thereto. In some embodiments, the secondary isolation material 710 may include dielectric material capable of absorbing microwave and/or RF emissions. In some embodiments the secondary isolation material 710 may be formed of a lossy dielectric. The lossy dielectric may be configured to absorb and/or reduce electromagnetic waves such as those forming the coupling between the input and output bond wires. Lossy dielectrics which may be useful as materials in the secondary isolation material 710 may include lossy dielectrics having a loss tangent greater than 0.1. In some embodiments, the loss tangent for the lossy dielectric being used as the secondary isolation material 710 may be based on the operating frequency of the multi-cell transistor 300. Examples of lossy dielectrics may include dielectrics containing carbon. In some embodiments, both the isolation material 690 of the wall structure 686 and the secondary isolation material 710 may be formed of a same lossy dielectric, but the present invention is not limited thereto In some embodiments, the secondary isolation material 710 may be formed of a lossy dielectric that is different from the isolation material 690. In some embodiments, the secondary isolation material 710 may be formed of a first material (e.g., a conductive material, lossy dielectric, and/or magnetic material) and the isolation material 690 of the wall structure 686 may be formed of a second material (e.g., a conductive material, lossy dielectric, and/or magnetic material) that is different from the first material.

In some embodiments, the secondary isolation material 710 may include a magnetic material, such as, for example, ferrite and/or nickel.

Figure 8A:
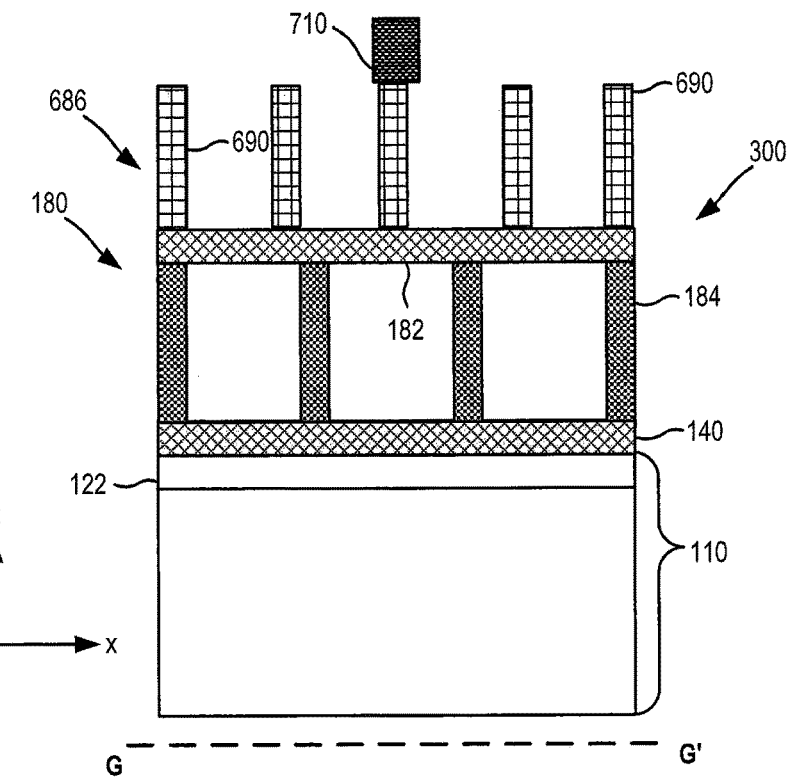
FIGS. 8A and 8B are cross sectional views, taken along lines G-G' and H-H' of FIG. 7A, of an additional embodiment of the present invention that includes additional isolation between the input and output bonds of the multi-cell transistor.
Figure 8B:
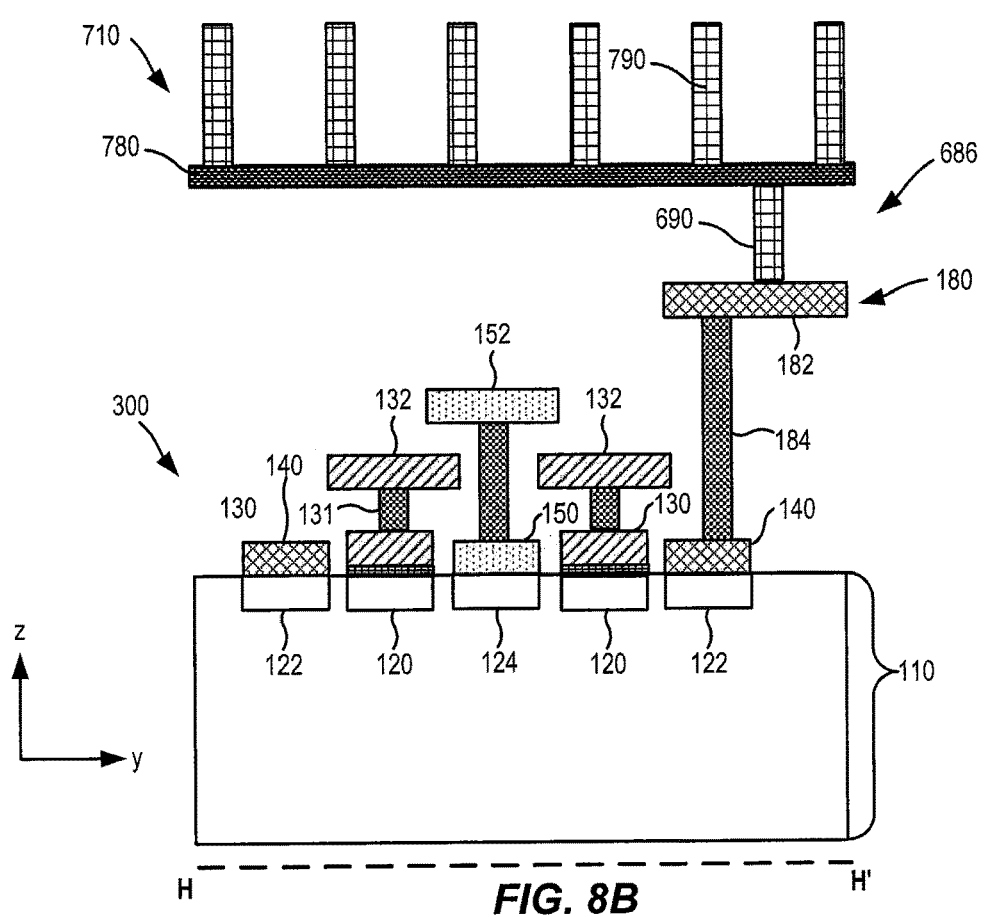

In some embodiments, as illustrated in FIGS. 7A-7C, both the wall structure 686 and the secondary isolation material 710 may be provided as a metal wall. However, it will be understood that other configurations are possible without deviation from the present invention. For example, FIGS. 8A and 8B are cross sections of additional embodiments in which both the wall structure 686 and the secondary isolation material 710 are provided as a plurality of vertical segments. FIGS. 8A and 8B are cross-sectional views taken along lines G-G' and H-H' of FIG. 7A.

For example, referring to FIGS. 8A and 8B, the wall structure 686 may be constructed of a plurality of segments of isolation material 690 that vertically extend from the metal pad 182 of the isolation structure 180. The wall structure 686 may, for example, be configured similarly to the wall structure 686 described herein with respect to FIG. 6B.

The secondary isolation material 710 may be composed of a secondary horizontal segment 780 and a plurality of secondary vertical segments 790. The horizontal segment 780 may be electrically connected to one of the segments of isolation material 690 of the wall structure 686. In this way, the secondary isolation material 710 may be connected to a reference signal (e.g., ground) through the metal pad 182 of the isolation structure 180.

FIGS. 7A, 7B, 8A, and 8B illustrate non-limiting examples of ways in which a wall structure 686 may be combined with and/or connected to a secondary isolation material 710. However, the present invention is not limited to the configurations of FIGS. 7A, 7B, 8A, and 8B. Other configurations, including combinations of configurations, such as those illustrated in FIGS. 6A-6D, may be used without deviating from the present invention. For example, the wall structure 686 may be configured in a first embodiment (e.g., a metal wall, a plurality of segments, or a mesh) and the secondary isolation material 710 may be configured in a second embodiment (e.g., a metal wall, a plurality of segments, or a mesh) that is different from the first embodiment. For example, the secondary isolation material 710 may be implemented as a metal wall and the wall structure 686 may be implemented as a plurality of vertical segments. Moreover, the invention is not limited to the configurations illustrated in FIGS. 6A and 6D. It will be understood that other configurations of isolation material, either between adjacent groups of transistor cells or between input and output bond wires, are within the scope of the present invention.

Figure 9:
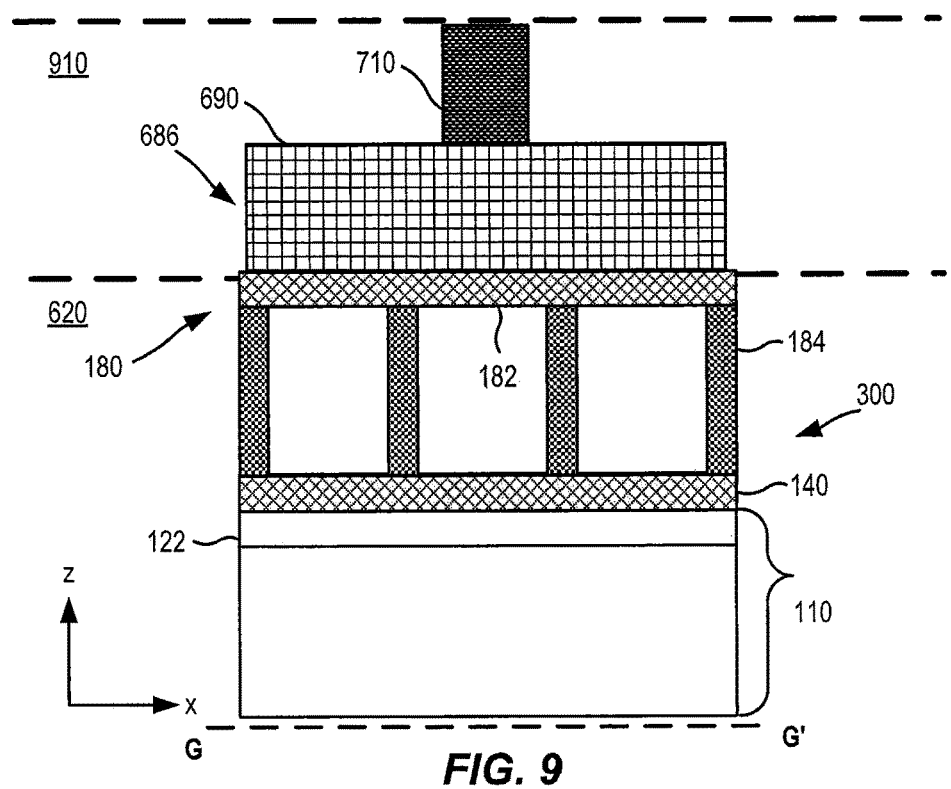
FIG. 9 is a cross-sectional view, taken along the line G-G' of FIG. 7A, of a multi-cell transistor incorporating a plastic overmold.

In some embodiments, the wall structure 686 and the secondary isolation material 710 may be covered by an overmold as part of a packaging process. FIG. 9 is a cross-sectional view, taken along line G-G' of FIG. 7A, of a multi-cell transistor 300 incorporating an overmold. FIG. 9 includes structures similar to those discussed with respect to FIGS. 2A-2C and FIGS. 5A-5C. Similar reference numbers in FIG. 9 refer to identical or similar structures as those discussed herein with respect to FIGS. 2A-2C and FIGS. 5A-5C, and a repetitive discussion thereof will be omitted. Referring to FIG. 9, the multi-cell transistor 300 may be placed inside a package as part of a packaging process to provide the packaged transistor device 700 of FIG. 7A. As part of the packaging process, an overmold 910 may be formed on the multi-cell transistor 300. In some embodiments, the multi-cell transistor 300 may include a protection and/or passivation layer 620. The overmold 910 may encase elements of the transistor configuration, including the wall structure 686 and the secondary isolation material 710. The overmold 910 may be constructed of a plastic or a plastic polymer compound. Though FIG. 9 illustrates an overmold 910 used within the packaged transistor device 700, the present invention is not limited thereto. In some embodiments, the packaged transistor device 700 may utilize an air cavity.

In some embodiments, the wall structure 686 and/or the secondary isolation material 710 may be formed prior to encasing the multi-cell transistor 300 in the overmold 910. In some embodiments, the wall structure 686 may be formed prior to encasing the multi-cell transistor 300 in the overmold 910 and the secondary isolation material 710 may be formed after the overmold 910 is provided. For example, the overmold 910 may be etched and/or otherwise recessed, and the secondary isolation material 710 may be formed in the recessed overmold 910 so as to contact the wall structure 686. In some embodiments, a first portion of the overmold 910 may be provided, and the wall structure 686 may be formed in the first portion of the overmold 910. A second portion of the overmold 910 may subsequently be provided, and the secondary isolation material 710 may be formed in the second portion of the overmold 910. Methods for forming the isolation material in an overmold are discussed in U.S. patent application Ser. No. 16/208,821 incorporated by reference herein.

Figure 10:
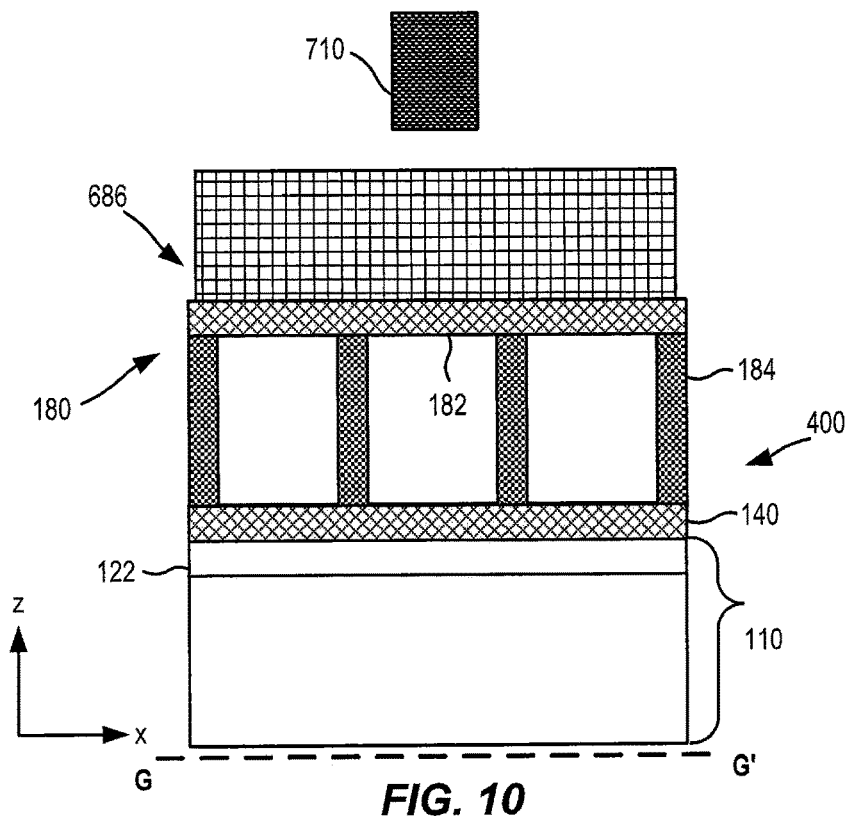
FIG. 10 is a cross-sectional view, taken along the line G-G' of FIG. 7A, of a multi-cell transistor in which a wall structure is separate from a secondary isolation material.

Though embodiments herein have discussed configurations in which the wall structure 686 is connected to the secondary isolation material 710, the present invention is not limited thereto. In some embodiments, the secondary isolation material 710 may be separate from the wall structure, as illustrated in FIG. 10. FIG. 10 is cross-sectional view taken along line G-G' of FIG. 7A. In some embodiments, the secondary isolation material 710 may be separated and electrically floating with respect to the wall structure 686. In some embodiments, the secondary isolation material 710 may be separated from the wall structure 686, but both the secondary isolation material 710 and the wall structure 686 may be connected to a common reference signal (e.g., ground).

The multi-cell transistors according to embodiments of the present invention may be used in a variety of different applications. As noted above, one such application is as an RF power amplifier. When implemented as an RF power amplifier, the device may be a stand-alone device or, alternatively may be implemented as a monolithic microwave integrated circuit that includes the RF transistor amplifier (which may be a single stage or a multistage amplifier) along with, for example, an input impedance matching network, an output impedance matching network and/or one or more inter-stage impedance matching networks that are all implemented as a single integrated circuit chip.

The invention described herein is technology independent, which means it can be applied for LDMOS, GaN, and other high-power RF transistor technologies. While embodiments of the present invention are illustrated with reference to a LDMOS and HEMT structures, the present inventive concepts are not limited to such devices. Thus, embodiments of the present invention may include other transistor devices having a plurality of unit cells and a controlling electrode. Embodiments of the present invention may be suitable for use in any transistor device where a wider controlling electrode is desired and multiple unit cells of the device are present. Thus, for example, embodiments of the present invention may be suitable for use in various types of devices, such as, MESFETs, MMICs, SITs, LDMOS, BJTs, pHEMTs, etc., fabricated using SiC, GaN, GaAs, silicon, etc.

Pursuant to embodiments of the present invention, a multi-cell transistor comprises a semiconductor structure, a plurality of unit cell transistors that are electrically connected in parallel, each unit cell transistor extending in a first direction in the semiconductor structure, wherein the unit cell transistors are spaced apart from each other along a second direction, and an isolation structure that is positioned between a first group of the unit cell transistors and a second group of the unit cell transistors.

In some embodiments, the isolation structure is above the semiconductor structure.

In some embodiments, a first distance in the second direction between two adjacent unit cell transistors in the first group of the unit cell transistors is less than a second distance in the second direction between a first unit cell transistor that is at one end of the first group of the unit cell transistors and a second unit cell transistor that is in the second group of the unit cell transistors, where the second unit cell transistor is adjacent the first unit cell transistor.

In some embodiments, the isolation structure is electrically connected to a reference signal.

In some embodiments, the isolation structure further comprises a metal pad, and a wall structure that is electrically connected to the metal pad.

In some embodiments, the wall structure comprises a plurality of wall segments extending vertically from the metal pad.

In some embodiments, the wall structure comprises a plurality of first vertical wall segments connected with a plurality of second horizontal wall segments.

In some embodiments, the isolation structure comprises a plurality of vias that are disposed between the metal pad and the semiconductor structure.

In some embodiments, the isolation structure is electrically connected to a source region of one of the plurality of unit cell transistors.

In some embodiments, the multi-cell transistor further comprises a wall structure that comprises an isolation material configured to reduce a mutual coupling between the first group of the unit cell transistors and the second group of the unit cell transistors.

In some embodiments, the isolation material is a conductive isolation material, a magnetic isolation material, or a lossy dielectric isolation material.

In some embodiments, the multi-cell transistor further comprises an input bond wire electrically connected to a gate of a first unit cell transistor of the plurality of unit cell transistors, an output bond wire electrically connected to a drain of the first unit cell transistor, and a secondary isolation material between the input bond wire and the output bond wire.

In some embodiments, the isolation structure further comprises a wall structure, and where the secondary isolation material is electrically connected to the wall structure.

In some embodiments, the multi-cell transistor further comprises a plastic overmold on the secondary isolation material and the wall structure.

In some embodiments, the multi-cell transistor further comprises a wall structure comprising a bond wire that is electrically connected to a metal pad of the isolation structure, and an isolation material electrically connected to the bond wire.

Pursuant to embodiments of the present invention, a multi-cell transistor comprises a semiconductor structure, a plurality of unit cell transistors that are electrically connected in parallel, each unit cell transistor including a gate finger that extends in a first direction on a top surface of the semiconductor structure, the gate fingers spaced apart from each other along a second direction and arranged on the top surface of the semiconductor structure in a plurality of groups, and a respective isolation structure on the top surface of the semiconductor structure between each pair of adjacent groups.

In some embodiments, each respective isolation structure comprises a metal pad and a wall structure extending vertically from the metal pad.

In some embodiments, each isolation structure has a respective length in the second direction that exceeds a length in the second direction of a first of the unit cell transistors.

In some embodiments, each isolation structure further comprises a plurality of vias that physically and electrically connect each respective metal pad to a source region in the semiconductor structure.

In some embodiments, the wall structure comprises a plurality of wall segments extending vertically from the metal pad.

In some embodiments, the wall structure comprises an isolation material configured to reduce a mutual coupling between a first of the groups and a second of the groups.

In some embodiments, the isolation material is a conductive isolation material, a magnetic isolation material, or a lossy dielectric isolation material.

In some embodiments, the wall structure is electrically connected to the metal pad.

In some embodiments, each unit cell transistor comprises a drain finger that extends in the first direction on the top surface of the semiconductor structure, and the multi-cell transistor further comprises an input bond wire electrically connected to at least one of the gate fingers, an output bond wire electrically connected to at least one of the drain fingers, and a secondary isolation material extending in the second direction between the input bond wire and the output bond wire.

In some embodiments, the secondary isolation material is electrically connected to at least one wall structure of the isolation structures.

In some embodiments, each respective isolation structure comprises a wall structure, and the secondary isolation material extends in the second direction and the wall structure extends in the first direction.

Pursuant to embodiments of the present invention, a transistor device comprises a multi-cell transistor including a plurality of unit cell transistors that are electrically connected in parallel and that are spaced apart along a second direction and a first isolation structure that is positioned between a first group of the unit cell transistors and a second group of the unit cell transistors and extends in a first direction, an input bond wire electrically connected to a gate of a first unit cell transistor of the plurality of unit cell transistors, an output bond wire electrically connected to a drain of the first unit cell transistor, and a second isolation structure extending in the second direction between the input bond wire and the output bond wire.

In some embodiments, the transistor device further comprises a plurality of vias that that electrically connect a metal pad of the first isolation structure to at least one source region of the unit cell transistors.

In some embodiments, the first isolation structure comprises a metal pad that is electrically connected to a reference signal, and a wall structure that is electrically connected to metal pad, where the second isolation structure is electrically connected to the wall structure.

In some embodiments, the wall structure comprises a plurality of wall segments extending vertically from the metal pad.

In some embodiments, the wall structure comprises a plurality of first vertical wall segments connected with a plurality of second horizontal wall segments.

In some embodiments, the transistor device further comprises a plastic overmold on the second isolation structure and the wall structure.

In some embodiments, the second isolation structure is on the wall structure.

In some embodiments, the wall structure comprises an isolation material configured to reduce a mutual coupling between the first group of the unit cell transistors and the second group of the unit cell transistors.

In some embodiments, the isolation material is a conductive isolation material, a magnetic isolation material, or a lossy dielectric isolation material.

In some embodiments, the first direction is orthogonal to the second direction.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
a first unit cell transistor comprising a gate contact and a drain contact extending in a first direction;
a first electrically conductive element electrically connected to the gate contact;
a second electrically conductive element electrically connected to the drain contact;
an isolation material extending on the first unit cell transistor in a second direction that crosses the first direction, wherein the isolation material is configured to reduce a coupling between the first electrically conductive element and the second electrically conductive element; and
an isolation structure between the first unit cell transistor and a second unit cell transistor,
wherein the isolation material is electrically connected to the isolation structure.

2. The transistor device of claim 1, wherein the isolation material is physically between the first electrically conductive element and the second electrically conductive element in the first direction.

3. The transistor device of claim 1, wherein the isolation material is electrically connected to a reference signal.

4. The transistor device of claim 1, wherein the
isolation structure is between the first unit cell transistor and the second unit cell transistor in the second direction, and
wherein the isolation material extends on the isolation structure.

5. The transistor device of claim 4, wherein the isolation structure comprises a metal pad.

6. The transistor device of claim 1, wherein the isolation material is a magnetic isolation material, a dielectric isolation material, and/or a conductive isolation material that is physically separated from the first electrically conductive element and the second electrically conductive element.

7. The transistor device of claim 1, wherein the isolation material comprises a plurality of vertical segments.

8. A transistor device, comprising:
a plurality of unit cell transistors, each comprising a gate contact and a drain contact extending in a first direction, respective ones of the plurality of unit cells transistors spaced apart along a second direction that crosses the first direction;
an isolation material extending in the second direction above the plurality of unit cell transistors, the isolation material electrically connected to a reference signal; and
an isolation structure between a first unit cell transistor and a second unit cell transistor of the plurality of unit cell transistors,
wherein the isolation material is electrically connected to the isolation structure.

9. The transistor device of claim 8,
wherein the isolation structure is between, in the second direction, the first unit cell transistor and the second unit cell transistor
wherein the isolation material extends on the isolation structure.

10. The transistor device of claim 9, wherein the isolation structure comprises a metal pad.

11. The transistor device of claim 10, wherein the metal pad is electrically connected to a source region of the plurality of unit cell transistors.

12. The transistor device of claim 8, further comprising:
a first electrically conductive element electrically connected to a first gate contact of the gate contacts of the plurality of unit cell transistors; and
a second electrically conductive element electrically connected to a first drain contact of the drain contacts of the plurality of unit cell transistors,
wherein the isolation material extends between the first electrically conductive element and the second electrically conductive element.

13. The transistor device of claim 8, wherein the reference signal is ground.

14. The transistor device of claim 8, further comprising a gate runner that is electrically connected to and extends above a first gate contact of the gate contacts,
wherein the isolation material extends above the gate runner.

15. A transistor device, comprising:
a first gate-side element and a second drain-side element electrically connected to one of a plurality of unit cell transistors of a semiconductor structure;
an isolation material extending on the plurality of unit cell transistors and physically between the first gate-side element and the second drain-side element, wherein the isolation material is configured to reduce a coupling between the first gate-side element and the second drain-side element, and
an isolation structure between a first group and a second group of the plurality of unit cell transistors, wherein the isolation material is electrically connected to the isolation structure.

16. The transistor device of claim 15, wherein the plurality of unit cell transistors extend in a first direction and are spaced apart from each other along a second direction,
wherein the isolation structure is between, in the second direction, the first and the second group of the plurality of unit cell transistors.

17. The transistor device of claim 16, wherein the isolation structure comprises a metal pad that is positioned farther from the semiconductor structure than are gate contacts of the plurality of unit cell transistors.

18. The transistor device of claim 16, wherein the isolation material has a longitudinal axis extending in the second direction.

19. The transistor device of claim 15, wherein the isolation material is a magnetic isolation material, a dielectric isolation material, and/or a conductive isolation material that is physically separated from the first gate-side element and the second drain-side element.

20. The transistor device of claim 15, wherein the isolation material is positioned farther from the semiconductor structure than are gate contacts of the plurality of unit cell transistors.

* * * * *